United States Patent [19]
Ohsawa

[11] Patent Number: 5,517,450
[45] Date of Patent: May 14, 1996

[54] SEMICONDUCTOR MEMORY DEVICE WITH REDUNDANCY CIRCUIT

[75] Inventor: Takashi Ohsawa, Yokohama, Japan

[73] Assignee: Kabushiki Kaisha Toshiba, Kawasaki, Japan

[21] Appl. No.: 302,474

[22] Filed: Sep. 12, 1994

[30] Foreign Application Priority Data

Sep. 13, 1993 [JP] Japan .................................. 5-227419

[51] Int. Cl.$^6$ .................................................. G11C 7/00
[52] U.S. Cl. .................. 365/200; 365/225.7; 365/230.03
[58] Field of Search ................................. 365/200, 201, 365/230.03, 225.7

[56] References Cited

U.S. PATENT DOCUMENTS

| | | | |
|---|---|---|---|
| 4,935,899 | 6/1990 | Morigami | 365/200 |
| 5,272,672 | 12/1993 | Ogihara | 365/200 |
| 5,357,470 | 10/1994 | Namekawa | 365/200 |

FOREIGN PATENT DOCUMENTS

| | | |
|---|---|---|
| 4-103099 | 4/1992 | Japan . |
| 6-28890 | 2/1994 | Japan . |

OTHER PUBLICATIONS

IEEE Journal of Solid–State Circuits, "A 45–ns 16–Mbit DRAM with Triple–Well Structure", vol. 24, No. 5, Oct. 1989, pp. 1170–1175.

Primary Examiner—David C. Nelms
Assistant Examiner—Son Mai
Attorney, Agent, or Firm—Banner & Allegretti, Ltd.

[57] ABSTRACT

A semiconductor memory device includes a memory cell array divided into a plurality of blocks, the row of memory cells is selected by a row selection circuit, and the column of the memory cells is selected by a column selection circuit for the plurality of blocks. Spare memory cells are respectively provided for the plurality of blocks and the spare memory cell is selected for each block by a spare column selection circuit. When a defective memory cell is contained in the memory cells, the defective memory cell is replaced by the spare memory cell for each block unit by use of a replacing circuit. A selection controlling circuit controls the row selection circuit to simultaneously activate at least two blocks. When defects are present in at least two blocks which are simultaneously activated, selection of the blocks which are simultaneously activated is changed by a changing circuit.

40 Claims, 17 Drawing Sheets

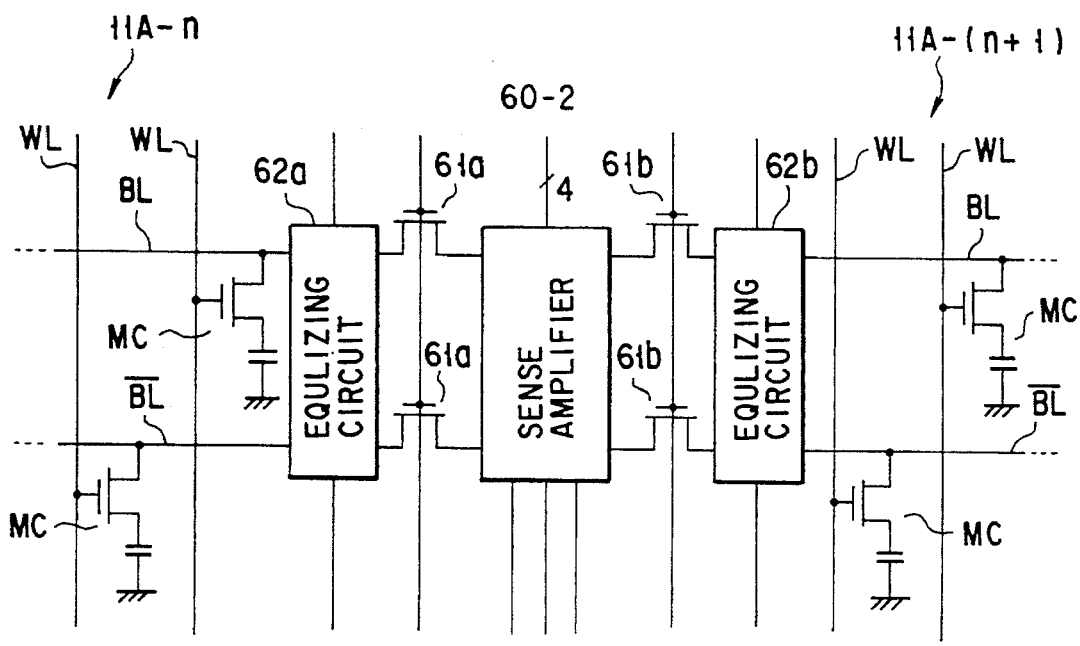
F I G. 10
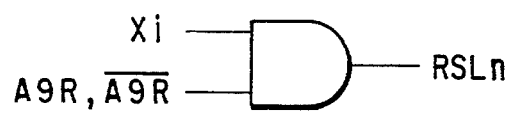
F I G. 11
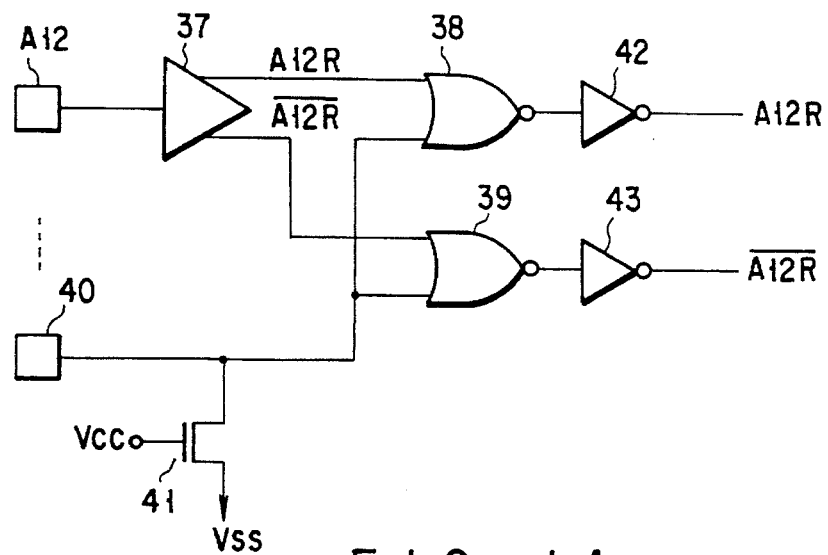
F I G. 14

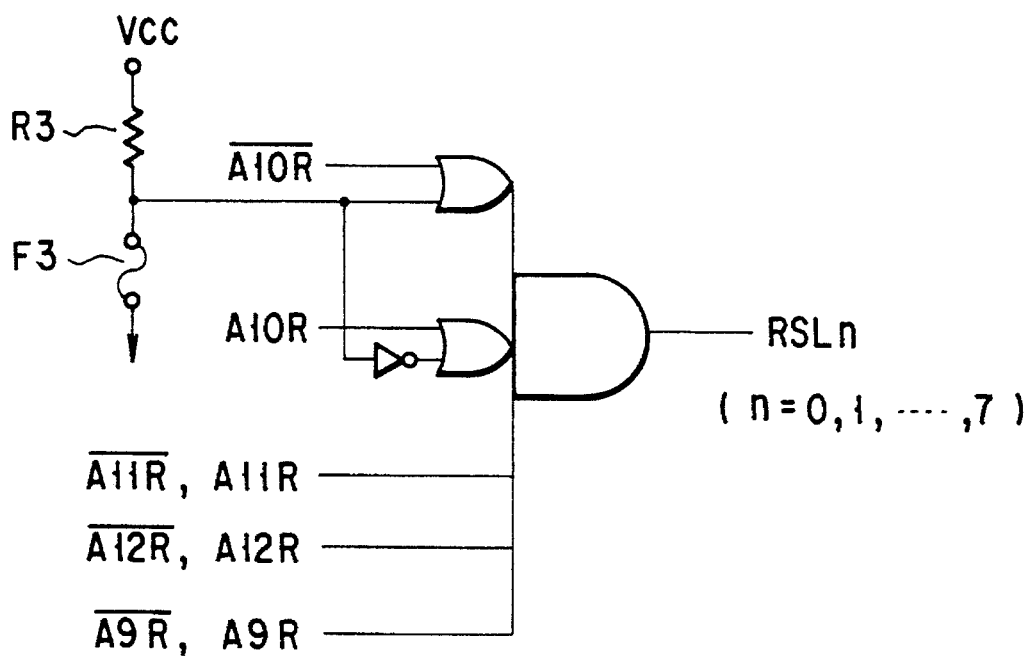
F I G. 23
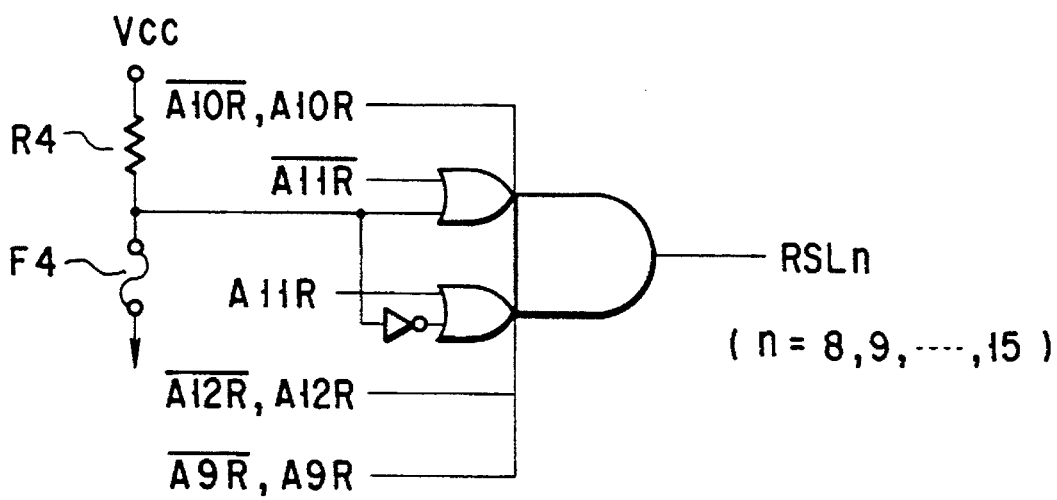
F I G. 24

SEMICONDUCTOR MEMORY DEVICE WITH REDUNDANCY CIRCUIT

BACKGROUND OF THE INVENTION

1. Field of the Invention

This invention relates to a semiconductor memory device having a redundancy circuit, and more particularly to a dynamic random access memory (DRAM) which has a memory cell array divided into a large number of blocks and in which a plurality of blocks can be simultaneously activated.

2. Description of the Related Art

In recent years, the chip size of a DRAM has tended to increase as the integration density becomes higher. In order to reduce the chip size, it is effective to reduce not only the pattern size of a memory cell but also the occupied area of the peripheral circuit. For this purpose, in recent years, a column decoder tends to be commonly used by a plurality of blocks by use of a two-layered metal interconnection. That is, word lines formed of a first-level metal interconnection are arranged in parallel to the gate electrodes formed of polysilicon, column selection lines formed of a second-level metal interconnection are arranged in a direction perpendicular to the word line (in a direction parallel to the bit lines) and are commonly used for each block. The RC delay due to the word line is suppressed by short-circuiting the gate electrodes of polysilicon to the word line at some points and the peripheral circuit is made compact by placing a column decoder at one portion of the memory cell array.

FIG. 1 shows a pattern layout of the conventional chip in a 64-Mbit DRAM utilizing the above-described technique. A memory cell array 11 is divided into four subarrays 11A to 11D. Each of the subarrays 11A to 11D has a memory capacity of 16 Mbits and the subarrays 11A to 11D are respectively divided into 16 blocks of 1 Mbit 11A-1 to 11A-16, 11B-1 to 11B-16, 11C-1 to 11C-16, and 11D-1 to 11D-16. A first row decoder 12-1 which is commonly used by the subarrays 11A and 11C is arranged between the subarrays 11A and 11C. A second row decoder 12-2 which is commonly used by the subarrays 11B and 11D is arranged between the subarrays 11B and 11D. A column decoder 13A for the subarray 11A and a column decoder 13B for the subarray 11B are arranged between the subarrays 11A and 11B. Further, a column decoder 13C for the subarray 11C and a column decoder 13D for the subarray 11D are arranged between the subarrays 11C and 11D. A peripheral circuit 14 is formed in an area between the column decoders 13A and 13B and an area between the column decoders 13C and 13D. A column selection line CSLa is formed to extend over the blocks 11A-1 to 11A-16 of the subarray 11A (one column selection line is shown in FIG. 1 as a representative, but in general, a large number of column selection lines are formed in parallel). Likewise, column selection lines CSLb, CSLc and CSLd are formed to extend over the respective blocks 11B-1 to 11B-16, 11C-1 to 11C-16 and 11D-1 to 11D-16 of the subarrays 11B, 11C and 11D. The column selection lines CSLa to CSLd in the subarrays 11A to 11D are respectively selected by outputs of the column decoders 13A to 13D.

As is typically shown in the block 11A-1, paired bit lines BL, $\overline{BL}$ are formed to extend in the same direction as the column selection line CSL in each block. Further, word lines WL are formed to extend in a direction perpendicular to the paired bit lines BL, $\overline{BL}$.

As shown in FIG. 2, in each of the blocks 11A-1 to 11A-16, 11B-1 to 11B-16, 11C-1 to 11C-16 and 11D-1 to 11D-16, memory cells MC, sense amplifiers SA, output controlling transistors T1, T2, column selection lines CSL, paired output lines DO, $\overline{DO}$, word lines WL, and paired bit lines BL, $\overline{BL}$ are formed. Each of the column selection lines CSL is connected to the gates of the corresponding output controlling transistors T1, T2. An output of the sense amplifier SA on a column selected by a column selection signal output from the column decoder 13 is output via the paired output lines DO, $\overline{DO}$.

The redundancy technique in the semiconductor memory device of the above-described pattern layout is disclosed in Jpn. Pat. Appln. KOKAI Publication No. 4-103099 by the applicant of this application, corresponding U.S. Pat. No. 5,272,672, Jpn. Pat. Appln. KOKAI Publication No. 6-28890 by the applicant of this application, and corresponding U.S. patent application Ser. No. 08/035,196 filed on Mar. 22, 1993. The technique disclosed in the above Jpn. Pat. Appln. KOKAI Publications and the U.S. Patent Specifications is to relieve the memory device by use of one spare column selection line even when different column defects (containing bit defects) occur in the respective blocks.

FIG. 3 shows an example of the construction of the column decoder and spare column decoders which can relieve the memory device by use of one spare column selection line even when different column defects (containing bit defects) occur in the respective blocks in the semiconductor memory device shown in FIG. 1. The column decoder 13A effects the column selecting operation for all of the blocks 11A-1 to 11A-16 in the subarray 11A, the column decoder 13B effects the column selecting operation for all of the blocks 11B-1 to 11B-16 in the subarray 11B, the column decoder 13C effects the column selecting operation for all of the blocks 11C-1 to 11C-16 in the subarray 11C, and the column decoder 13D effects the column selecting operation for all of the blocks 11D-1 to 11D-16 in the subarray 11D. In FIG. 3, the subarray 11A is shown as a representative, but the other subarrays 11B, 11C and 11D are formed with the same construction.

In FIG. 3, spare column decoders 15-1 to 15-16 are provided to correspond to the blocks 11A-1 to 11A-16. The spare column decoders 15-1 to 15-16 are supplied with selection signals RSL1 to RSL16 of the respective blocks and a column address A0C to A7C. In the spare column decoders 15-1 to 15-16, addresses of defective columns of the respective blocks are previously programmed. The programming is executed by selectively applying a laser beam to and melting (which is hereinafter referred to as laser blow) corresponding fuses provided in the respective spare column decoders, for example. A spare column decoder 15-n (n is an integer of 1 to 16) selected by an input row address outputs a corresponding one of signals SCSL1 to SCSL16 which is set to the high level when an input column address coincides with previously programmed defective column address. The logical sum of the signals SCSL1 to SCSL16 is derived by an OR gate 16 which in turn outputs a spare column selection signal SCSL. Since a signal SCSLi (i is an integer of 1 to 16) output from a non-selected block is set at the low level, an output of the spare column decoder of the selected block is output as the signal SCSL. The signal SCSL is also input to the column decoder 13A, and when the signal SCSL is set to the high level, a normal column selection signal CSLj (j is an integer of 1 to 128) which is to be selected by the address is controlled to be set into the non-selected state.

Therefore, when a defective column address in a block corresponding to the input row address coincides with the input corresponding to the input row address coincides with the input column address A0C to A7C, a spare column selection line SCSL is selected instead of a normal column selection line CSL. With the above construction, defects of different column addresses in the respective blocks can be compensated for by use of one spare column selection line SCSL.

In the redundancy technique described in the above Jpn. Pat. Appln. KOKAI Publications and the U.S. Patent Specifications, since one of the blocks in each of the subarrays 11A to lid is activated as shown by the hatching in FIG. 4 in the case of 64-Mbit DRAM of 8K refresh cycle, the defects can be compensated for by the above-described technique. However, in the case of a 4K refresh cycle device, two blocks in each of the subarrays 11A to lid are simultaneously activated as shown in FIG. 5. At this time, if defects are present in different columns of the two blocks which are simultaneously activated, the above-described relieving method cannot be applied. The problem is explained in detail below.

That is, in a case where two blocks are simultaneously activated, two of the block selection signals RSL1 to RSL16 are raised to the high level in the circuit shown in FIG. 3. When the input column address A0C to A7C coincides with an address of the defective column in one of the two blocks which are simultaneously selected, a column selection signal SCSLi corresponding to the block is raised to the high level so that the potential of the spare column selection line SCSL will be raised to the high level. As a result, the column decoder 13A is controlled to set the normal column selection line CSL into the non-selected state. However, if a block corresponding to the actually input column address is the other one of the two blocks which are simultaneously activated, memory cells corresponding to the column address are the memory cells connected to the normal column selection line CSL, and therefore, data thereof cannot be read out. The problem can be solved by constructing the block selection signal to determine whether the column selection signal SCSLi is output or not by referring to not only the row address but also the column address, but in this case, the column selection signal SCSLi is set to the high level after inputting of the column address A0C to A7C and then the column selection signal SCSL is raised to the high level. As a result, a period of time from the inputting of the column address A0C to A7C to the outputting of the signals SCSL and SCL becomes longer and the access time is made longer.

FIG. 6 shows the manufacturing yield of a device when attention is paid to one subarray, that is, 16 Mbits when a 64-Mbit DRAM is formed by use of the above redundancy technique. In FIG. 6, the abscissa indicates the probability that a randomly selected column is defective and indicates the quality (maturity or the degree of completeness) of the manufacturing line. The ordinate indicates the yield for the probability of defects. A solid line 21 indicates the yield in a case where only one column in the 16 Mbits can be compensated for, that is, where the above redundancy technique is not used, solid lines 22 to 24 indicate yields in a case where the above redundancy technique is used. The solid line 22 indicates the yield in the case of 8K refresh cycle, the solid line 23 indicates the yield in the case of 4K refresh cycle, and the solid line 24 indicates the yield in the case of 2K refresh cycle. As shown in FIG. 6, the relieving efficiency can be enhanced and the manufacturing yield can be improved by use of the technique disclosed in the Jpn. Pat. Appln. KOKAI Publications and the U.S. Patent Specifications cited before.

However, if the refresh cycle is lowered and a plurality of blocks in one subarray are simultaneously activated and when addresses of different defective columns are present in the respective blocks which are simultaneously activated, the defective columns cannot be relieved. Therefore, as is clearly shown in FIG. 6, the relieving effect is lowered as the refresh cycle is lowered to a smaller value such as 4K, 2K (as the number of blocks which are simultaneously activated is increased).

SUMMARY OF THE INVENTION

Accordingly, an object of this invention is to provide a semiconductor memory device in which a plurality of blocks can be simultaneously activated and defects can be compensated for with high probability even when addresses of different defective columns are present in the blocks which are simultaneously activated.

The above object can be attained by a semiconductor memory device comprising a memory cell array divided into a plurality of blocks; a row selection circuit for selecting a row of the memory cell array; a column selection circuit for selecting a column of the memory cell array for the plurality of blocks; spare memory cells respectively provided for the plurality of blocks; a spare column selection circuit for selecting the spare memory cell for each block; a replacing circuit for replacing a defective memory cell by the spare memory cell for each block unit if the defective memory cell is contained in the memory cells of the memory cell array; a selection controlling circuit for controlling the row selection circuit to simultaneously activate at least two blocks; and a changing circuit for changing selection of blocks to be simultaneously activated by the row selection circuit and selection controlling circuit.

With the above construction, since selection of a plurality of blocks to be simultaneously activated can be changed by the changing circuit, the block selection can be changed if an address of defective column is present in the plurality of blocks to be simultaneously activated so as to prevent the addresses of defective columns from being provided in the plurality of blocks to be simultaneously activated, thereby making it possible to compensate for the defect with high probability.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 10 is a circuit diagram more concretely showing one sense amplifier extracted as a representative in the circuit of FIG. 9, bit line equalizing circuits provided on both sides thereof, paired bit lines, and memory cell portion;

FIG. 11 is a circuit diagram showing an example of the construction of a block selection signal generation circuit in the circuit of FIG. 9;

FIG. 14 is a circuit diagram showing an example of the construction of an address input changing circuit for inputting an address corresponding to the refresh cycle to the address assignment changing circuit shown in FIG. 13;

FIGS. 23 and 24 are circuit diagrams showing an example of the construction of a block selection signal generation circuit in the circuit shown in FIG. 22.

DETAILED DESCRIPTION OF THE PREFERRED EMBODIMENTS

A semiconductor memory device of this invention has a function of changing the address assignment of row address for block selection by programming by laser blow or the like after checking the presence of defective columns. That is, in the case of a 4K refresh device of a 64-Mbit DRAM, if addresses of different defective columns are present in the two blocks which are simultaneously activated in the default state (a state in which no process is effected), the two blocks in which the defects are present are prevented from being simultaneously activated by replacing the address assignment in one of the blocks by that in the other block. For this purpose, the presence of defective columns in each block is first checked in the die sort test, and whether the 4K refresh operation can be effected or not is determined in the 64-Mbit DRAM, for example. The 4K refresh operation can be effected if no column defect is present in the two blocks which are simultaneously selected, and the 4K refresh operation can be effected by programming if two blocks can be prevented from being simultaneously selected by changing the block to be activated even when addresses of defective columns are present in the two blocks which are simultaneously selected. Further, whether the DRAM in which the 4K refresh operation cannot be effected can be used in the 8K refresh cycle or not is determined. Then, a chip which cannot be used in the 8K refresh cycle is determined to be a defective device.

The construction and method for changing the blocks to be simultaneously activated are explained in detail below.

Figure 7:
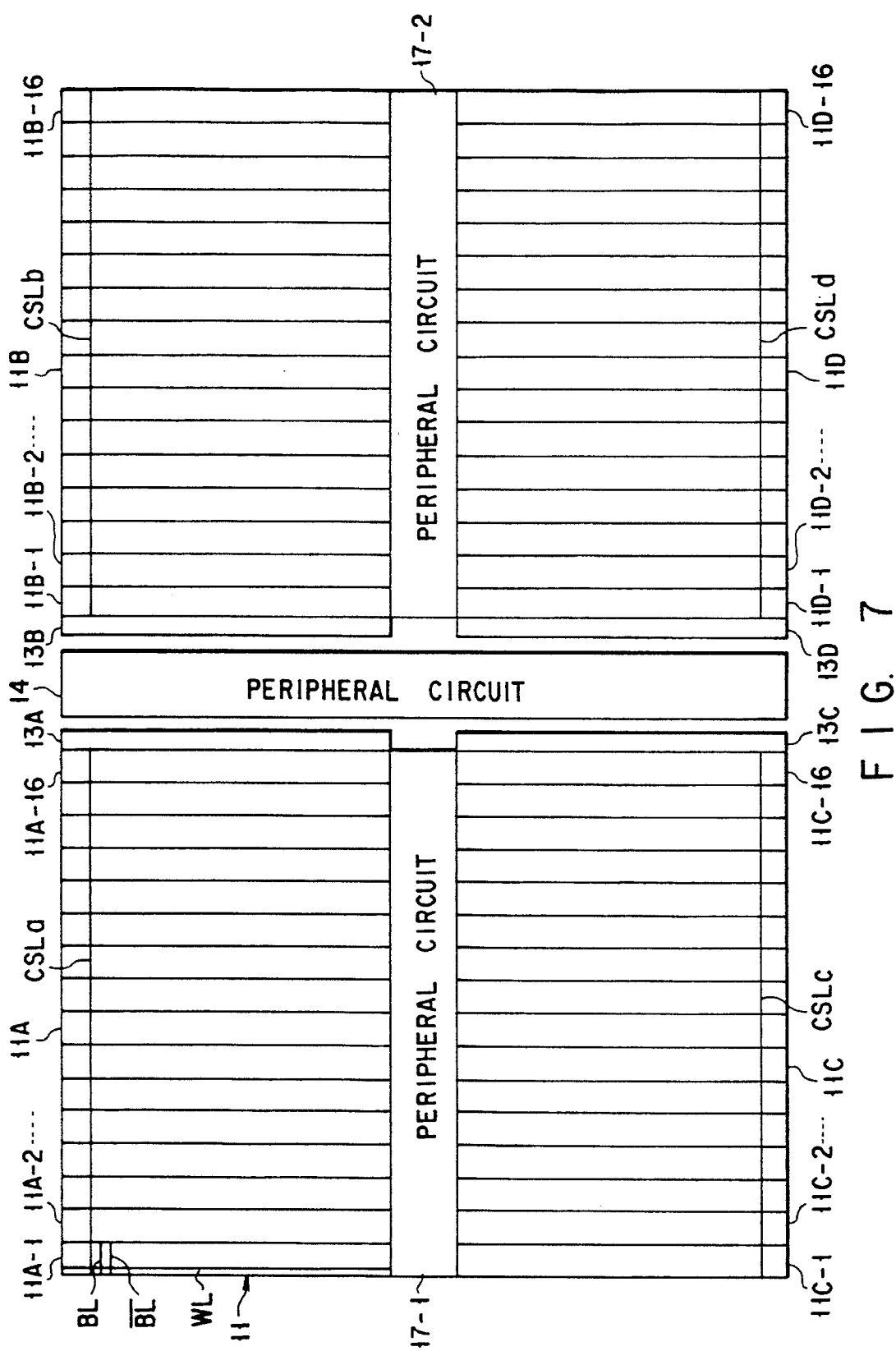
FIG. 7 is a pattern plan view showing an example of the pattern layout of a 64-Mbit DRAM, for illustrating a semiconductor memory device according to one embodiment of this invention.

FIG. 7 shows the pattern layout of a chip, for illustrating a semiconductor memory device according to one embodiment of this invention. The semiconductor memory device is presented as an example of 64-Mbit DRAM. A memory cell array 11 is divided into four subarrays 11A to 11D and each of the subarrays 11A to 11D has a memory capacity of 16 Mbits. The subarrays 11A to 11D are respectively divided into 16 blocks of 1 Mbit 11A-1 to 11A-16, 11B-1 to 11B-16, 11C-1 to 11C-16, and 11D-1 to 11D-16. A first peripheral circuit 17-1 is arranged between the subarrays 11A and 11C. A second peripheral circuit 17-2 is arranged between the subarrays 11B and 11D. A column decoder 13A for the subarray 11A and a column decoder 13B for the subarray 11B are arranged between the subarrays 11A and 11B. Further, a column decoder 13C for the subarray 11C and a column decoder 13D for the subarray 11D are arranged between the subarrays 11C and 11D. A third peripheral circuit 14 is formed in an area between the column decoders 13A and 13B and an area between the column decoders 13C and 13D. A column selection line CSLa is formed to extend over the blocks 11A-1 to 11A-16 of the subarray 11A (one column selection line is shown in FIG. 7 as a representative, but in general, a large number of column selection lines are formed in parallel). Likewise, column selection lines CSLb, CSLc and CSLd are formed to extend over the respective blocks 11B-1 to 11B-16, 11C-1 to 11C-16 and 11D-1 to 11D-16 of the subarrays 11B, 11C and 11D. The column selection lines CSLa to CSLd in the subarrays 11A to 11D are respectively selected by outputs of the column decoders 13A to 13D.

As is typically shown in the block 11A-1, paired bit lines BL, $\overline{BL}$ are formed to extend in the same direction as the column selection line CSL in each block. Further, word lines WL are formed to extend in a direction perpendicular to the paired bit lines BL, $\overline{BL}$.

Figure 3:
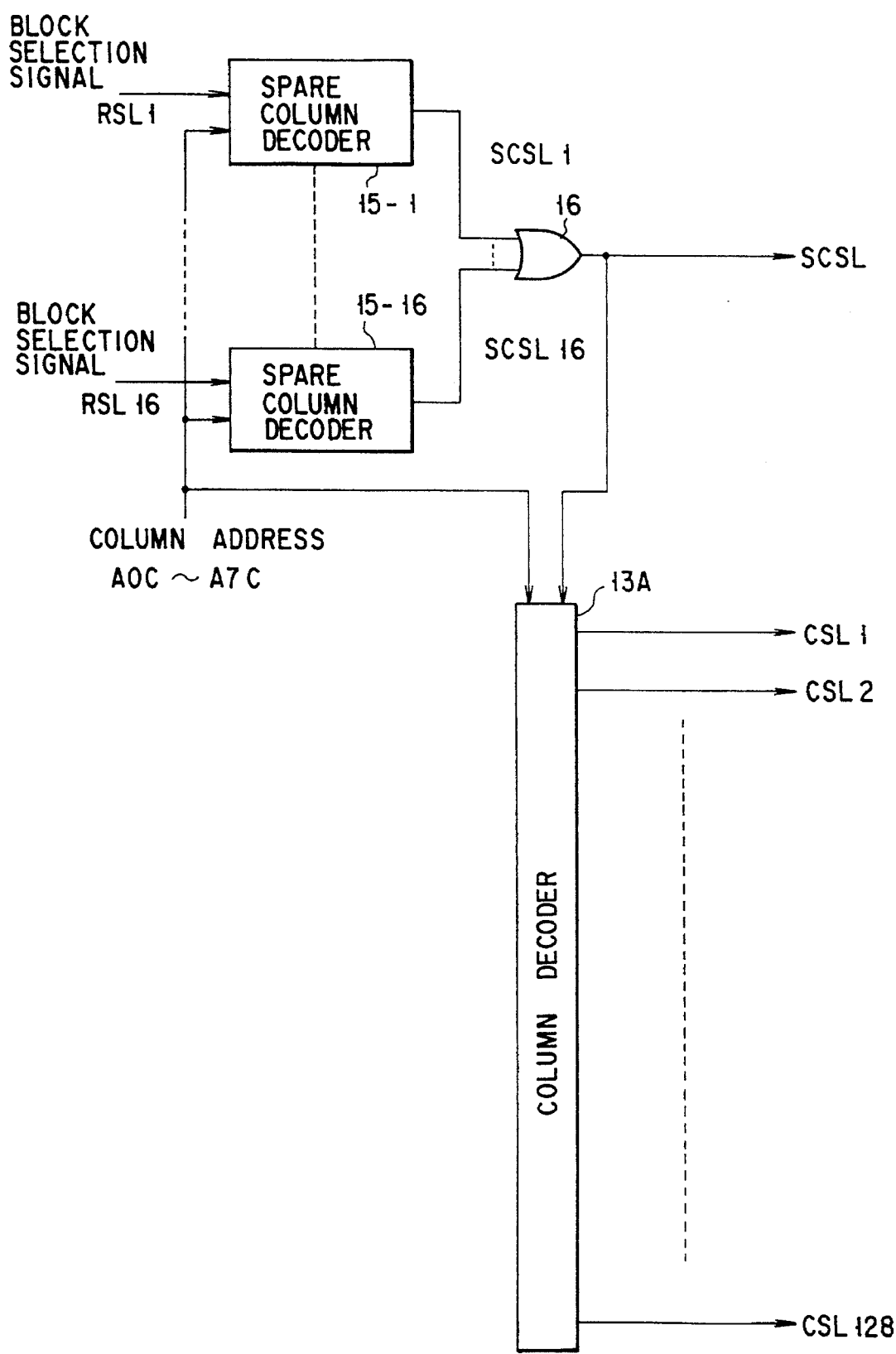
FIG. 3 is a circuit diagram showing an example of the construction of a column decoder and a spare column decoder in the semiconductor memory device shown in FIG. 1.
Figure 4:
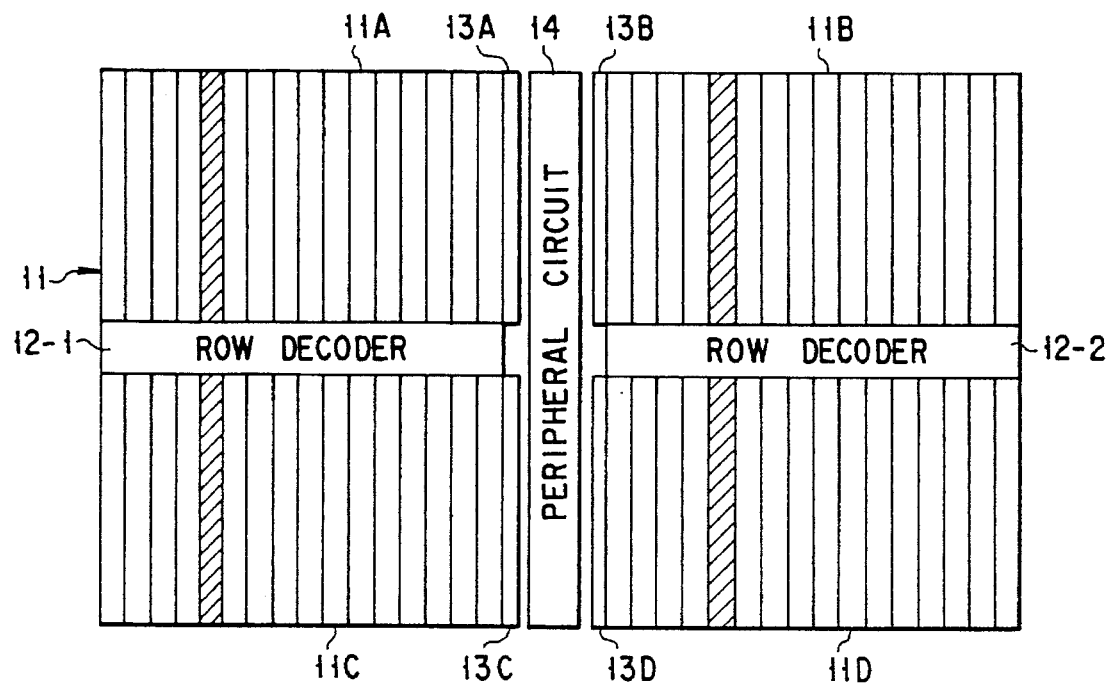
FIG. 4 is a pattern plan view for illustrating the operation of activating the block of an 8K refresh cycle device in the semiconductor memory device shown in FIG. 1.
Figure 5:
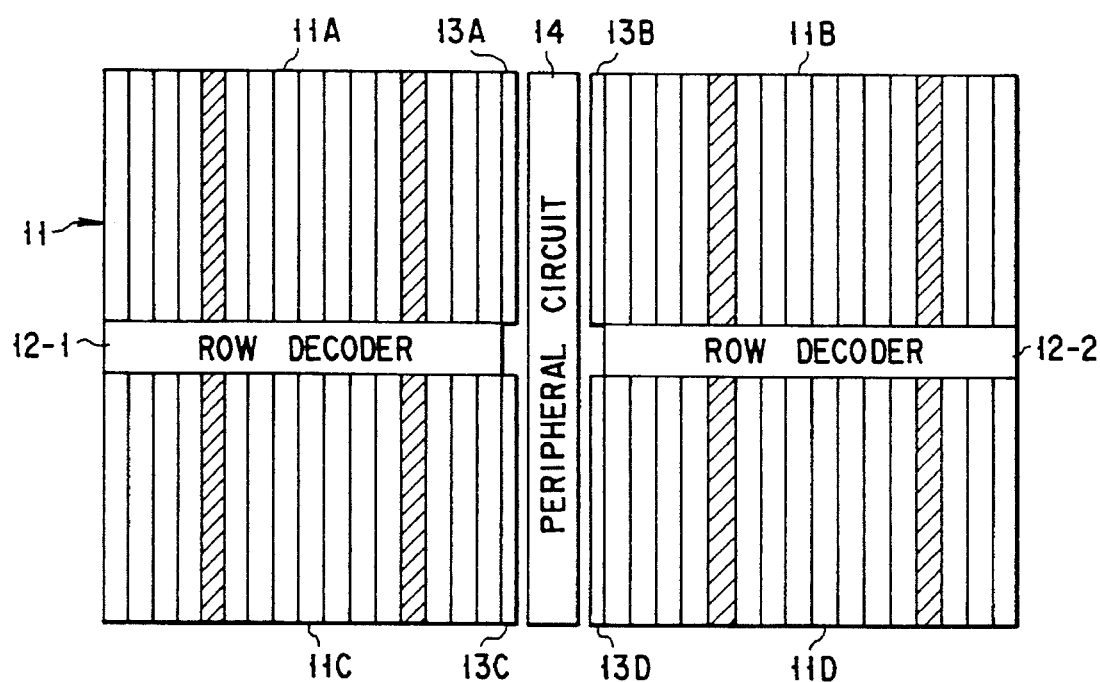
FIG. 5 is a pattern plan view for illustrating the operation of activating the block of a 4K refresh cycle device in the semiconductor memory device shown in FIG. 1.

The semiconductor memory device of FIG. 7 has spare memory cells and the column decoders and spare column decoders of the same construction as that shown in FIG. 3, and the memory device can be relieved by use of one spare column selection line even when different column defects (containing bit defects) occur in the respective blocks.

Figure 8:
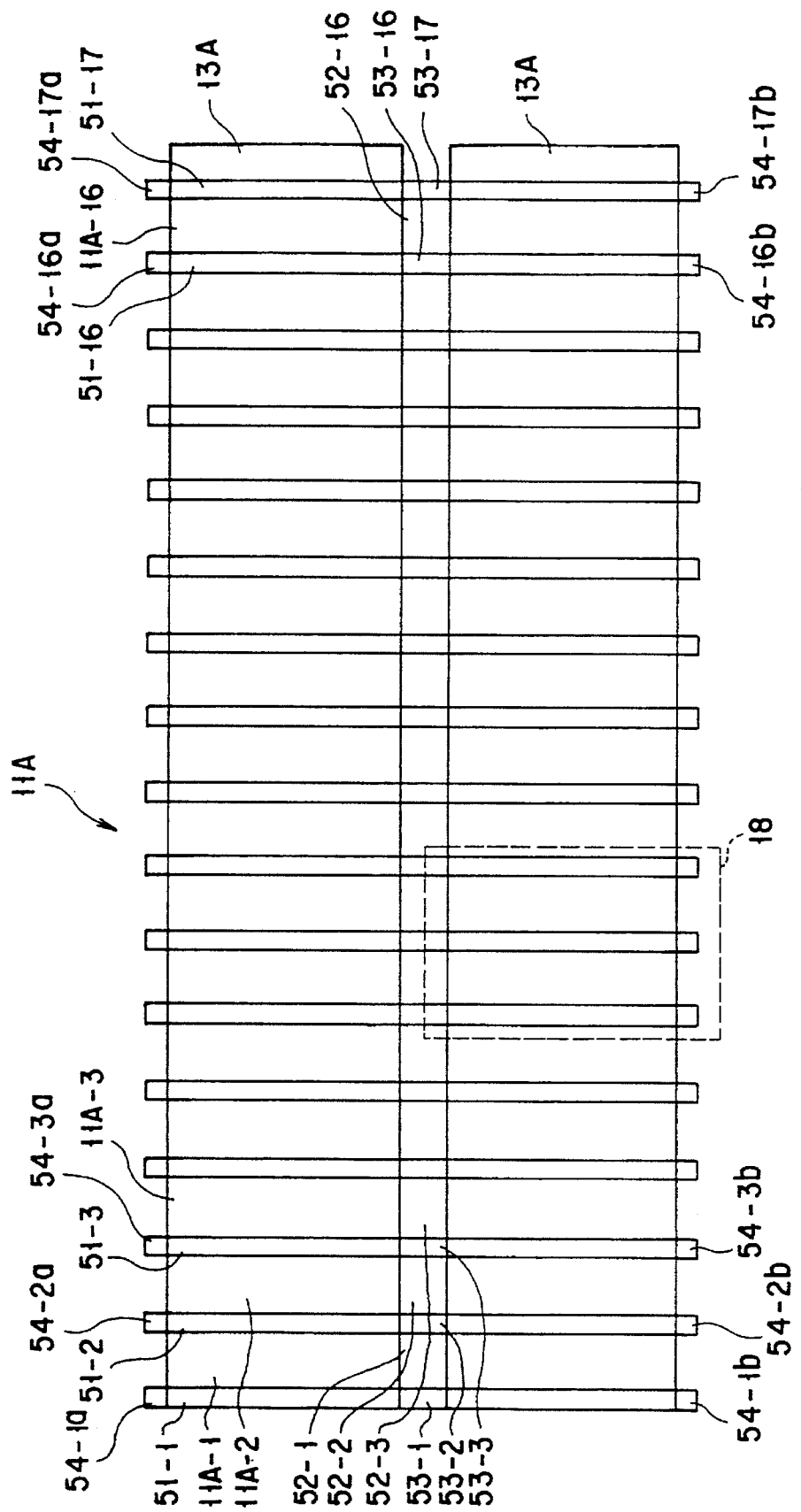
FIG. 8 is a pattern plan view showing one subarray extracted from the semiconductor memory device of FIG. 7 in detail.

FIG. 8 shows in detail one subarray 11A in the semiconductor memory device shown in FIG. 7 (in this example, the subarray 11A is shown as a representative, but the other subarrays 11B, 11C and 11D are formed with the same construction). As described before, the subarray 11A is divided into 1-Mbit blocks (cell arrays) 11A-1 to 11A-16 and circuit areas 51-1 to 51-17 are provided for the respective blocks 11A-1 to 11A-16. In each of the circuit areas 51-1 to 51-17, a sense amplifier, data output circuit (DQ gate), equalizing circuit (EQL gate), and a selection circuit ($\phi_T$ circuit) for selecting one of the paired bit lines in the two adjacent blocks are provided.

The subarray 11A is divided into two portions in the vertical direction (in a direction along the column selection line CSLa) and row decoders 52-1 to 52-16 are arranged in the central portions of the respective blocks 11A-1 to 11A-16. Further, in the central portions of the circuit areas 51-1 to 51-17, block selection signal generators and DQ buffers 53-1 to 53-17 are arranged. With the above arrangement, the blocks 11A-1 to 11A-16 are equivalently divided into 32 memory cell arrays of substantially 512 Kbit.

In portions corresponding to the circuit areas 51-1 to 51-17 on both sides of the subarray 11A, sense amplifier drivers 54-1a to 54-17a and 54-1b to 54-17b are arranged. The sense amplifiers in the circuit areas 51-1 to 51-17 are driven by the sense amplifier drivers 54-1a to 54-17a and 54-1b to 54-17b.

Figure 9:
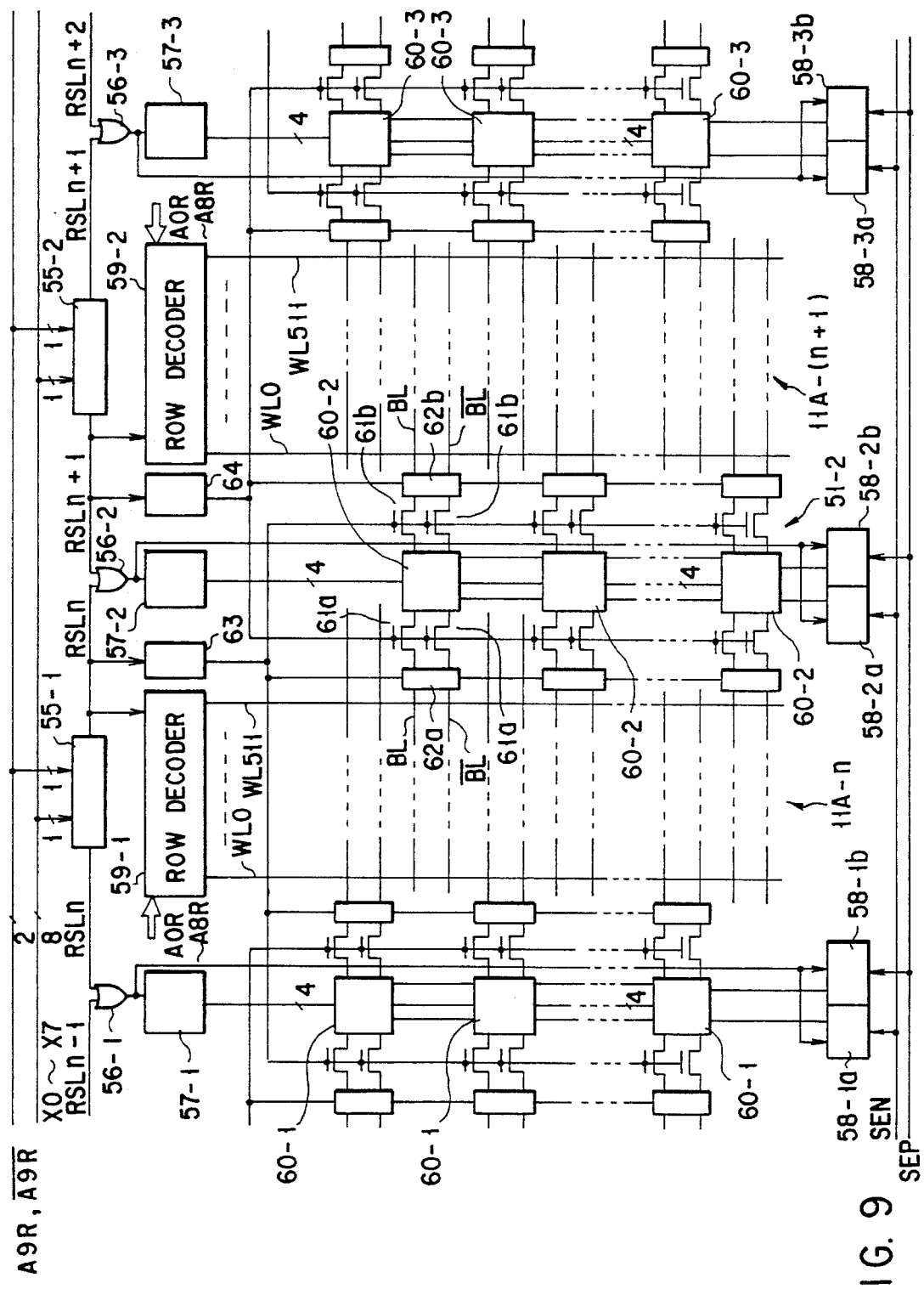
FIG. 9 is a circuit diagram showing the circuit construction of an extracted part of the pattern shown in FIG. 8 in detail.

FIG. 9 shows the circuit construction of an extracted area 18 surrounded by broken lines in the pattern shown in FIG. 8 in detail. A row address A9R, $\overline{\text{A9R}}$ and signals X0 to X7 are supplied to block selection signal generators 55-1, 55-2, - - - for each bit. Block selection signals RSLn−1 and RSLn are supplied to an OR gate 56-1 whose output signal is supplied to a DQ buffer 57-1, N-channel sense amplifier driver 58-1a, and P-channel sense amplifier driver 58-1b. The signals RSLn and RSLn+1 are supplied to an OR gate 56-2 whose output signal is supplied to a DQ buffer 57-2, N-channel sense amplifier driver 58-2a, and p-channel sense amplifier driver 58-2b. Likewise, the signals RSLn+1 and RSLn+2 are supplied to an OR gate 56-3 whose output signal is supplied to a DQ buffer 57-3, N-channel sense amplifier driver 58-3a, and P-channel sense amplifier driver 8-3b.

A row decoder 59-1 is supplied with a row address A0R to A8R and the signal RSLn output from the block selection signal generator 55-1 to select and drive the word lines WL0 to WL511 in the block 11A-n. Likewise, a row decoder 59-2 is supplied with a row address A0R to A8R and the output signal RSLn+1 of the block selection signal generator 55-2 to select and drive the word lines WL0 to WL511 in the block 11A-(n+1).

Sense amplifiers 60-2, 60-2, - - - arranged in the same direction as the word lines WL are driven by the N-channel sense amplifier driver 58-2a and P-channel sense amplifier driver 58-2b and data thereof is output to a data bus (not shown) via the DQ buffer 57-2, for example. The N-channel sense amplifier driver 58-2a is controlled by a sense amplifier enable signal SEN and the P-channel sense amplifier driver 58-2b is controlled by a sense amplifier enable signal SEP. On both sides of the sense amplifiers 60-2, 60-2, - - - , selection transistors 61a, 61b of the paired bit lines, bit line equalizing circuits 62a, 62b and paired bit lines BL, $\overline{\text{BL}}$ are provided. The bit line selection transistor 61b and the bit line equalizing circuit 62a are controlled by an equalize (EQL) signal and an output signal of a $\phi_T$ signal generator 63. On the other hand, the bit line selection transistor 61a and the bit line equalizing circuit 62b are controlled by the equalize (EQL) signal and an output signal of a $\phi_T$ signal generator 64. The equalize signal is a signal for equalizing the potentials of the paired bit lines BL and $\overline{\text{BL}}$ by means of the bit line equalize circuits 62a, 62b. Further, the $\phi_T$ signal is a selection signal for selecting one of the bit line pairs in the adjacent two blocks. With the above design, while the paired bit lines BL, $\overline{\text{BL}}$ (for example, block 11A-n) on one side of the sense amplifier 60-1 are selected, the paired bit lines BL, $\overline{\text{BL}}$ (block 11A-(n+1)) on the other side are set in the equalized state.

As shown in the drawing, the signal generators 63, 64 are commonly used by the adjacent bit line selection transistors and the bit line equalize circuits. The sense amplifiers 60-1, 60-1, - - - which are disposed adjacent to the sense amplifiers 60-2, 60-2, - - - with the block 11A-n disposed therebetween and the peripheral portion thereof are formed with the same circuit construction, and in the block 11A-n, paired bit lines BL, $\overline{\text{BL}}$ connected to the sense amplifiers 60-1, 60-1, - - - and paired bit lines BL, $\overline{\text{BL}}$ connected to the sense amplifiers 60-2, 60-2, - - - are alternately arranged. Further, sense amplifiers 60-3, 60-3, - - - which are disposed adjacent to the sense amplifiers 60-2, 60-2, - - - with the block 11A-(n+1) disposed therebetween and the peripheral portion thereof are formed with the same circuit construction, and in the block 11A-(n+1), paired bit lines BL, $\overline{\text{BL}}$ connected to the sense amplifiers 60-3, 60-3, - - - and paired bit lines BL, $\overline{\text{BL}}$ connected to the sense amplifiers 60-2, 60-2, - - - are alternately arranged.

In the blocks 11A-1 and 11A-(n+1), memory cells MC (DRAM cells) are disposed at intersecting portions between the word lines WL and the paired bit lines BL, $\overline{\text{BL}}$ as shown in FIG. 10.

Each of the block selection signal generators 55-1, 55-2, - - - in the circuit shown in FIG. 9 includes an AND gate as shown in FIG. 11. However, i in the signal Xi is 0 to 7, and n in the signal SLn is 0 to 15. That is, since logical products between the signals X0 to X7 and the row address A9R and logical products between the signals X0 to X7 and the row address $\overline{\text{A9R}}$ are derived, 16 block selection signals RSL0 to RSL15 can be obtained.

Figure 12:
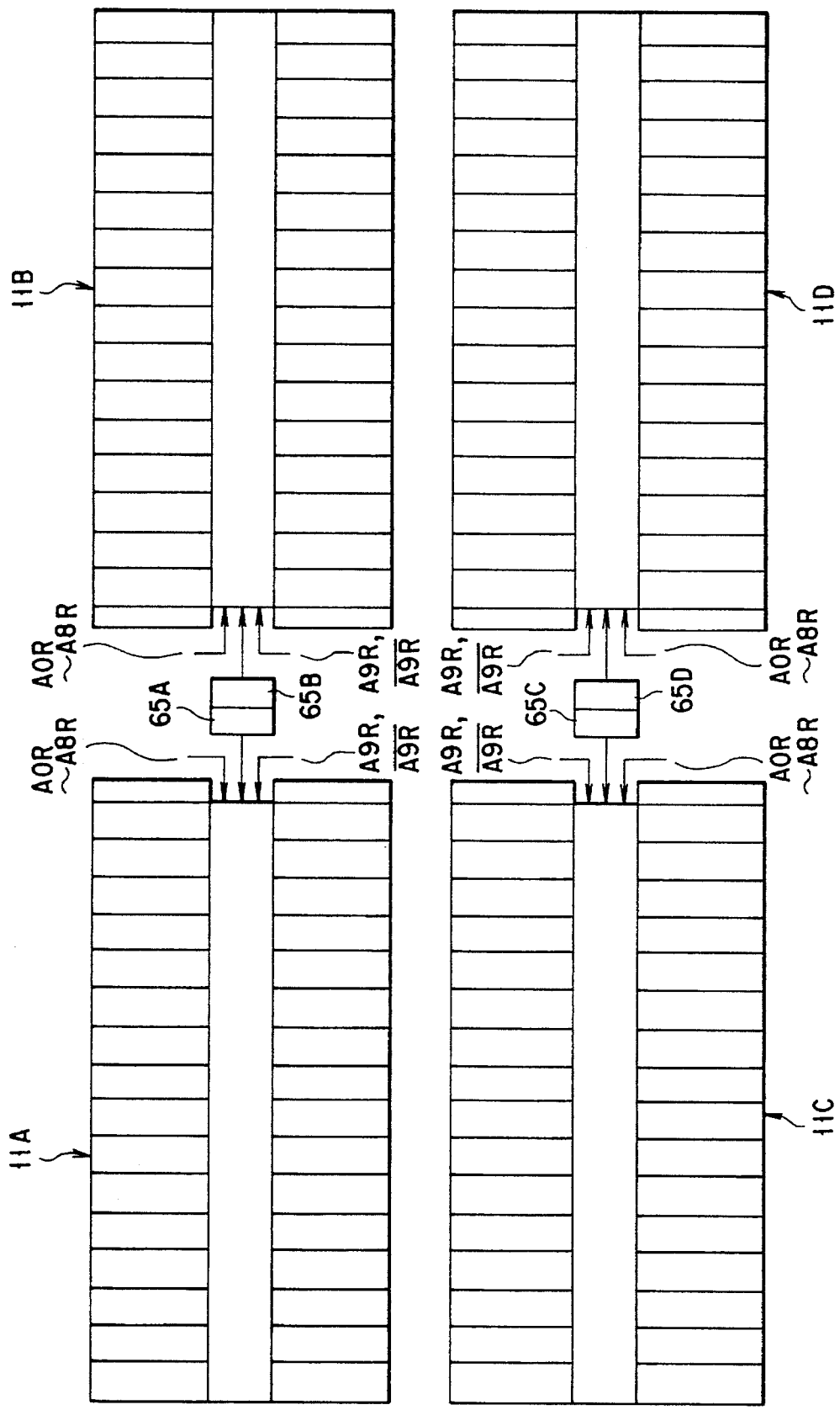
FIG. 12 is a pattern plan view for illustrating the arrangement in the chip of a signal generation circuit (address assignment changing circuit) for selecting two blocks among 16 blocks in each subarray of the semiconductor memory device of FIG. 7.

The generation circuit of a signal Xi (X0 to X7) in the semiconductor memory device shown in FIG. 7 is arranged as shown in FIG. 12. That is, Xi generation circuits 65A, 65B are arranged in an area between the subarrays 11A and 11B in the peripheral circuit 14, and Xi generation circuits 65C, 65D are arranged in an area between the subarrays 11C and 11D in the peripheral circuit 14. The row address A0R to A8R, an output of the Xi generation circuit 65A and row address A9R, $\overline{\text{A9R}}$ are supplied to the subarray 11A. The row address A0R to A8R, an output of the Xi generation circuit 65B and row address A9R, $\overline{\text{A9R}}$ are supplied to the subarray 11B. Further, the row address A9R, $\overline{\text{A9R}}$, an output of the Xi generation circuit 65C and row address A0R to A8R are supplied to the subarray 11C. Also, the row address A9R, $\overline{\text{A9R}}$, an output of the Xi generation circuit 65D 10 and row address A0R to A8R are supplied to the subarray 11D.

Figure 13:
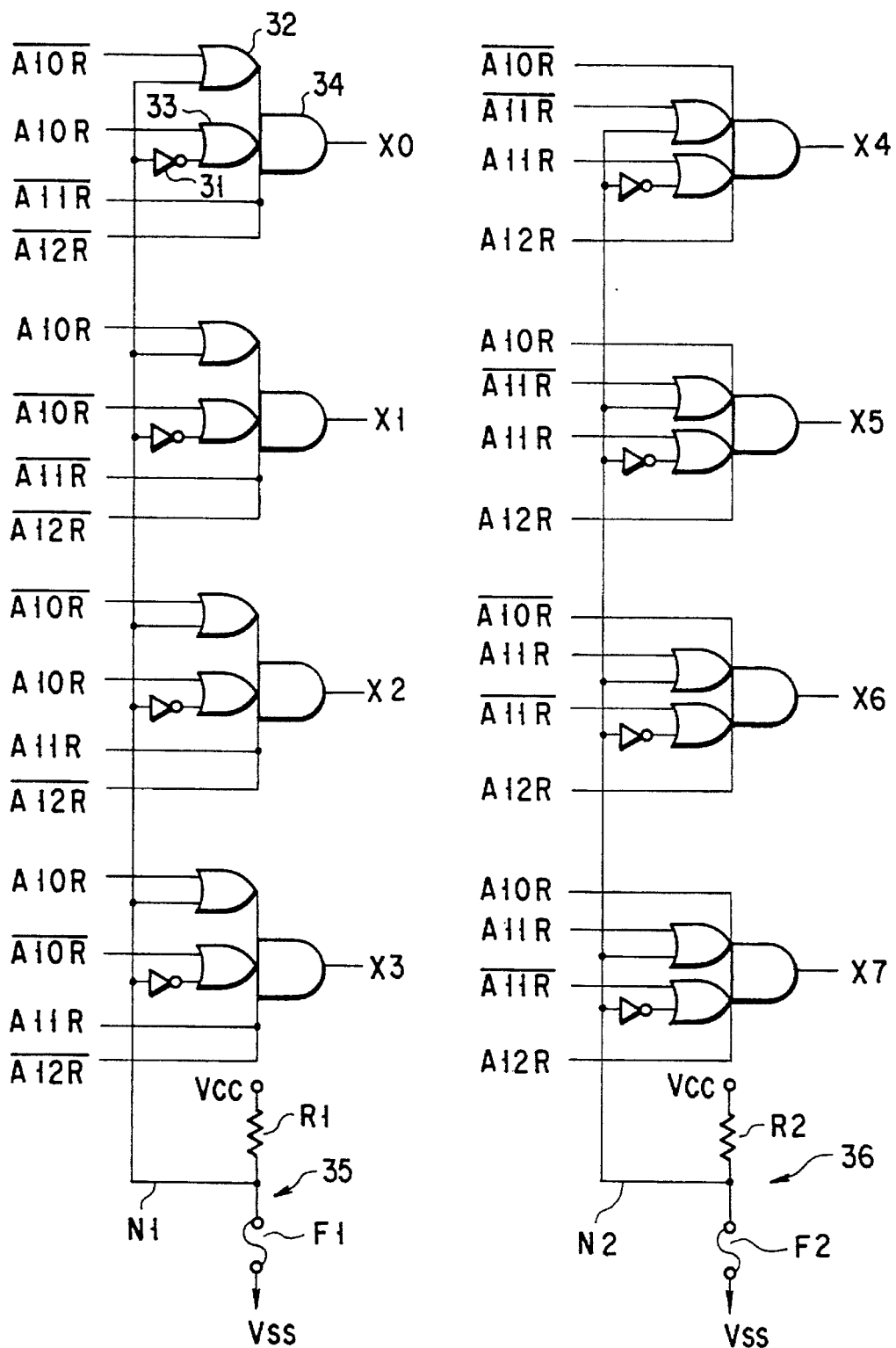
FIG. 13 is a circuit diagram showing an example of the construction of the address assignment changing circuit shown in FIG. 12.

FIG. 13 shows an example of the specific construction of the Xi generation circuits 65A to 65D shown in FIG. 12. The circuit shown in FIG. 13 acts as an address assignment changing circuit for changing the address assignment. The address assignment changing circuit has an inverter 31, OR gate 32, OR gate 33, and AND gate 34 as one unit circuit. Programming circuits 35 and 36 are provided on the upper-bit side and lower-bit side of the unit circuits. One of the unit circuits which outputs a signal X0 of least significant bit is taken as an example and explained. A row address $\overline{\text{A10R}}$ is input to one of the input terminals of the OR gate 32 and an output of the programming circuit 35 is supplied to the other input terminal of the OR gate. A row address A10R is input to one of the input terminals of the OR gate 33 and an output of the programming circuit 35 is inverted by the inverter 31 and then supplied to the other input terminal of the OR gate. The AND gate 34 is supplied with outputs of the OR gates 32, 33, and row addresses $\overline{A11R}$, $\overline{A12R}$. The other unit circuits have a different combination of the row address and the column address, but have substantially the same construction as that described above.

The programming circuit 35 has a series circuit of a load element of high resistance, for example, a resistor R1, connected between a power supply Vcc and a ground node vss and a fuse element F1 which can be programmed by laser blow or the like. An output of the programming circuit 35 is set to a low level when the fuse element F1 is not melted and is set to a high level when the fuse element is melted since the potential of a node N1 is raised by the resistor R1. The programming circuit 36 is constructed in the same manner as the programming circuit 35 to include a resistor R2 and a fuse element F2 and effects the same operation as the programming circuit 35.

Figure 15:
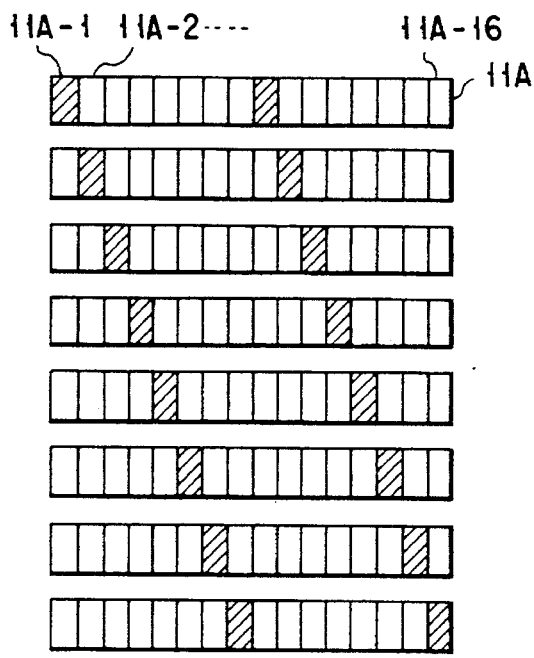
FIGS. 15 to 18 are diagrams schematically and time-sequentially showing blocks in the subarray which are simultaneously activated in the semiconductor memory device shown in FIG. 7.

FIG. 14 shows an example of the construction of an address input changing circuit for inputting a row address corresponding to the refresh cycle to the address assignment changing circuit shown in FIG. 13 according to the 4K refresh cycle or 8K refresh cycle. Row addresses A12R and $\overline{A12R}$ are created from an address signal input to the address terminal A12 by an address buffer 37. The row address A12R is supplied to one of the input terminals of a NOR gate 38 and the row address $\overline{A12R}$ is supplied to one of the input terminals of a NOR gate 39. The other input terminals of the NOR gates 38, 39 are connected to a changing signal input terminal 40. The changing signal input terminal 40 is applied with the power supply voltage vcc in the case of 4K refresh cycle and is set in the electrically floating state in the case of 8K refresh cycle. A transistor 41 is connected between the changing signal input terminal 40 and the ground node vss and the gate thereof is applied with the power supply voltage vcc so that it can be set in the normally conductive state with this connection, the other input terminals of the NOR gates 38, 39 are applied with a high level voltage in the case of 4K refresh cycle and a low level voltage in the case of 8K refresh cycle. An output of the NOR gate 38 is supplied as the row address A12R to the address assignment changing circuit and an output of the NOR gate 39 is supplied as the row address $\overline{A12R}$ to the address assignment changing circuit via an inverter FIG. 15 schematically and time-sequentially shows blocks at different timings in the subarray 11A (also, in the subarrays 11B to 11D) which are simultaneously activated in the semiconductor memory device shown in FIG. 7. As shown by hatched portions, a block 16-k (k=1 to 8) and a block 16-(k+8) are sequentially and simultaneously activated when addresses of different defective columns are present in the blocks which are simultaneously activated, the column decoder 13A is programmed to select blocks such that addresses of different defective columns will not lie in the blocks which are simultaneously activated, and selection of the blocks which are simultaneously activated is changed as shown in FIGS. 16 to 18.

Figure 16:
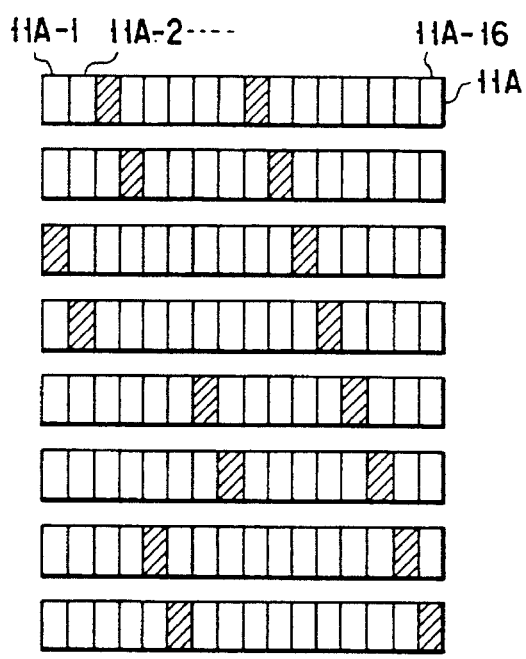

In an example of FIG. 16, blocks 11A-3 and 11A-9, blocks 11A-4 and 11A-10, blocks 11A-1 and 11A-11, blocks 11A-2 and 11A-12, blocks 11A-7 and 11A-13, blocks 11A-8 and 11A-14, blocks 11A-5 and 11A-15, and blocks 11A-6 and 11A-16 are sequentially and simultaneously activated.

Figure 17:
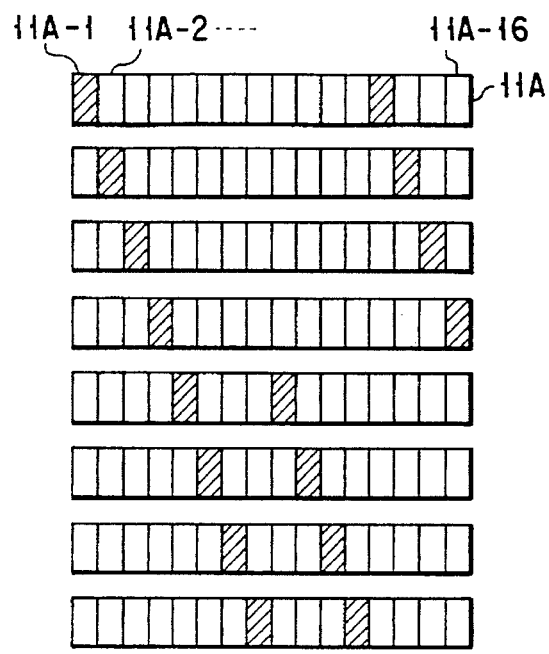

In an example of FIG. 17, blocks 11A-1 and 11A-13, blocks 11A-2 and 11A-14, blocks 11A-3 and 11A-15, blocks 11A-4 and 11A-16, blocks 11A-5 and 11A-9, blocks 11A-6 and 11A-10, blocks 11A-7 and 11A-11, and blocks 11A-8 and 11A-12 are sequentially and simultaneously activated.

Figure 18:
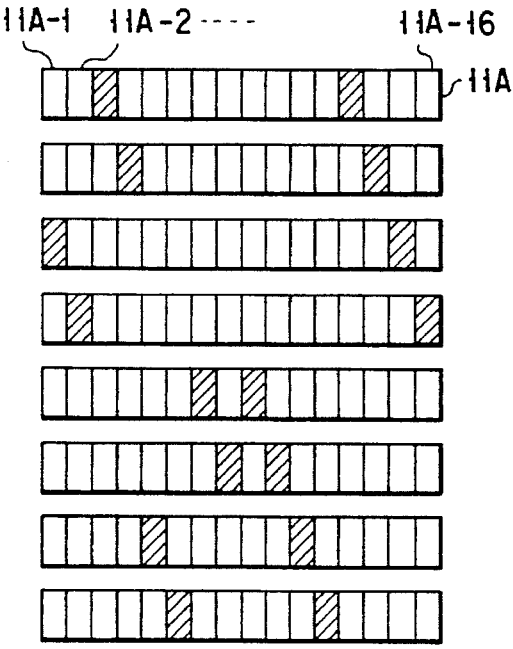

In an example of FIG. 18, blocks 11A-3 and 11A-13, blocks 11A-4 and 11A-14, blocks 11A-1 and 11A-15, blocks 11A-2 and 11A-16, blocks 11A-7 and 11A-19, blocks 11A-8 and 11A-10, blocks 11A-5 and 11A-11, and blocks 11A-6 and 11A-12 are sequentially and simultaneously activated.

If addresses of different defective columns are present in the blocks which are simultaneously activated when the blocks are selected as shown in FIG. 15, block selection is changed to the block selection shown in FIG. 16, 17 or 18, whether or not addresses of different defective columns are present in the blocks which are simultaneously activated is checked, and then an optimum one of the block selections of FIGS. 16 to 18 is selected.

Figure 19:
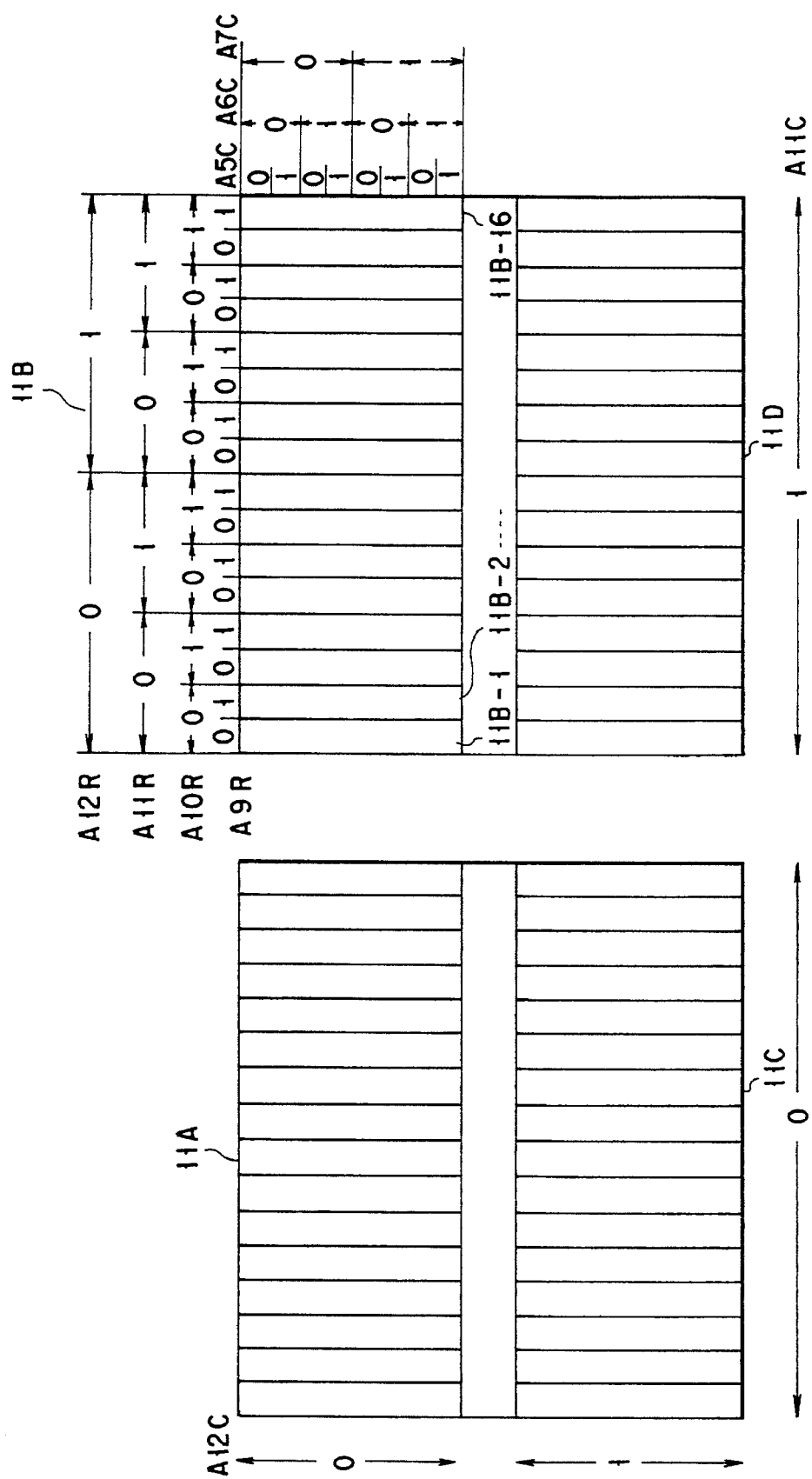
FIG. 19 is a diagram for illustrating an example of the address assignment in the case of 8K refresh cycle.

Next, the concrete address assignment method for changing the block selection as described above is explained in detail. FIG. 19 shows address assignment in the case of 8K refresh cycle. In the 8K refresh cycle, a block in one of the subarrays is selected. The positions of the four subarrays 11A to 11D in the vertical direction are selected by the column address A12C. That is, when the column address A12C is at a "0" level, the subarrays 11A and 11B are selected and when the column address A12C is at a "1" level, the subarrays 11C and 11D are selected. The positions of the four subarrays 11A to 11D in the horizontal direction are selected by the column address A11C. That is, when the column address A11C is at the "0" level, the subarrays 11A and 11C are selected and when the column address A11C is at the "1" level, the subarrays 11B and 11D are selected. Thus, one of the four subarrays 11A to 11D can be selected by the column addresses A12C and A11C.

Assuming that the column address A12C is set at the "0" level and the column address A11C is set at the "1" level so as to select the subarray 11B, one of the 16 blocks 11B-1 to 11B-16 of the subarrays 11B is selected by the row addresses A12R to A9R. The blocks 11B-1 to 11B-8 or the blocks 11B-9 to 11B-16 are selected by the row address A12R, and the blocks 11B-1 to 11B-4, the blocks 11B-5 to 11B-8, the blocks 11B-9 to 11B-12, or the blocks 11B-13 to 11B-16 are selected by the row address A11R. Further, two adjacent blocks among the four blocks which are selected by the row addresses A12R and A11R are selected by the row address A10R, and one of the two selected blocks is selected by the row address A9R. Further, the position in one block selected by the row addresses A12R to A9R is selected. The column address A7C selects the upper or lower position of the block and one of the 8 divided areas of the block is selected by the column addresses A6C, A5C.

Although not shown in the drawing, each of memory cells in the area selected by the row addresses A12R to A9R and column addresses A7C to A5C is selected by lower-bit row addresses A8R to A1R and column addresses A4C to A1C.

Figure 20:
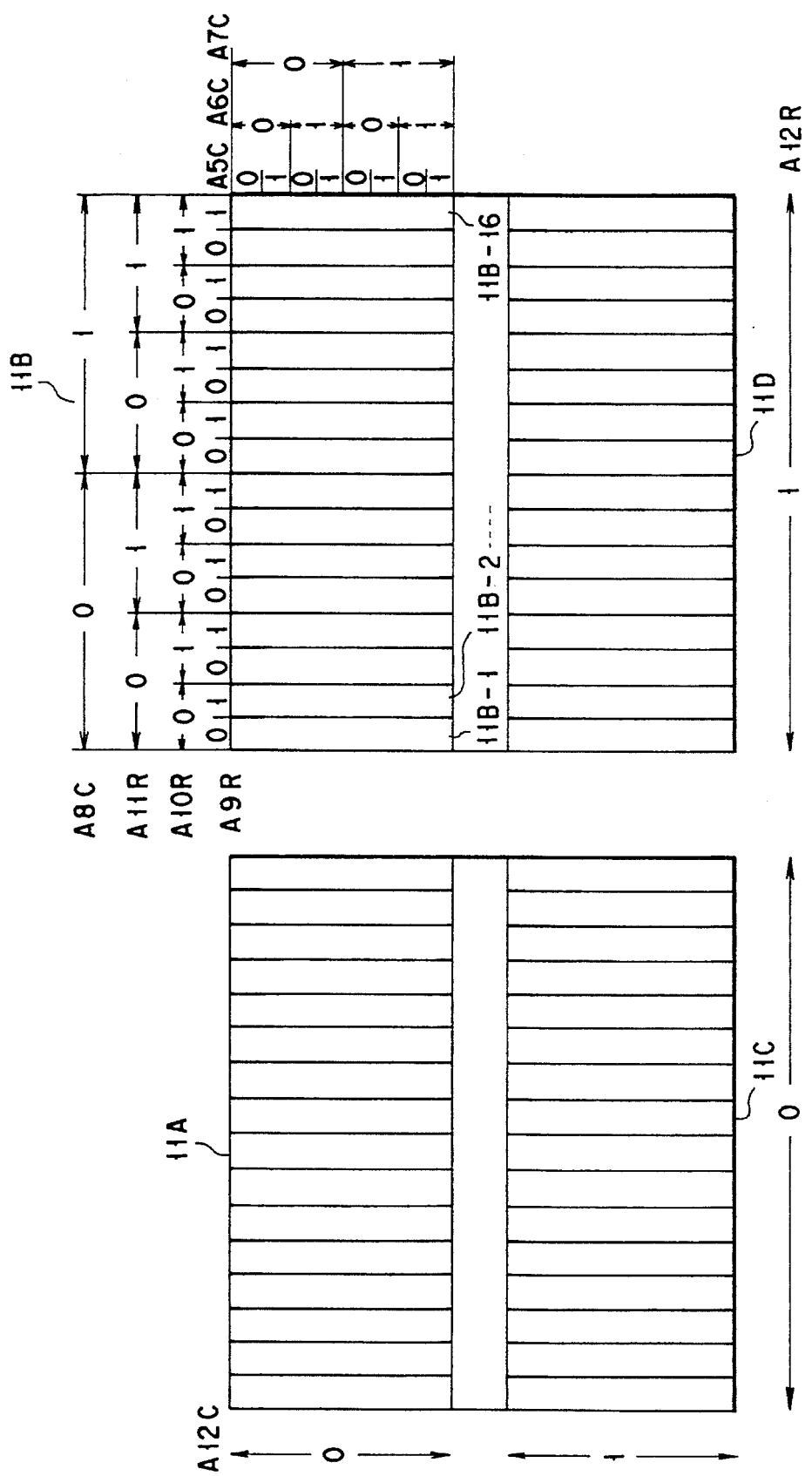
FIG. 20 is a diagram for illustrating an example of the address assignment in the case of 4K refresh cycle.

FIG. 20 shows address assignment in the case of 4K refresh cycle. The operation of selecting the upper or lower position of the four subarrays 11A to 11D by use of the column address A12C is effected in the same manner as in the case of 8K refresh cycle. When the column address A12C is at the "0" level, the subarrays 11A and 11B are selected, and when the column address A12C is at the "1" level, the subarrays 11C and 11D are selected. The right or left side position of the four subarrays 11A to 11D is selected by the row address A12R, when the row address A12R is at the "0" level, the subarrays 11A and 11C are selected and when the row address A12R is at the "1" level, the subarrays 11B and 11D are selected. Thus, one of the four subarrays 11A to 11D is selected by the column address A12C and row address A12R.

Assuming that the column address A12C is set at the "0" level and the row address A12R is set at the "1" level so as to select the subarray 11B, two of the 16 blocks 11B-1 to 11B-16 of the subarrays 11B are selected by the column address A5C and row addresses A11R to A9R. That is, the blocks 11B-1 to 11B-8 or the blocks 11B-9 to 11B-16 are selected by the column address A5C. At this time, since the column address is input after determination of the row address, two blocks are simultaneously selected by the row addresses A11R to A9R before the column address A5C is determined. More specifically, the blocks 11B-1 to 11B-4 and the blocks 11B-9 to 11B-12 are selected when the row address A11R is at the "0" level, and the blocks 11B-5 to 11B-8 and the blocks 11B-13 to 11B-16 are selected when the row address A11R is at the "1" level. Adjacent two of the blocks selected by the row addresses A12R and A11R are selected by the row address A10R and one of the two blocks is selected by the row address A9R.

Selection of the area in the block by the column addresses A7C to A5C is the same as that shown in FIG. 20, and the position in the two blocks selected by the column address A5C and row addresses A11R to A9R is selected. The column address A7C selects the upper or lower position of the block and two of the 8 divided areas of the two selected blocks are selected by the column addresses A6C, A5C. Each of the memory cells in the area selected by the column address A5C, row addresses A11R to A9R and column addresses A7C to A5C is selected by lower-bit row addresses A8R to A1R and column addresses A4C to A1C.

Next, the operation of changing the address assignment described above by use of the address assignment changing circuit shown in FIG. 13 and the address input changing circuit shown in FIG. 14 is explained in more detail. In the address assignment changing circuit shown in FIG. 13, eight signals of X0 to X7 output from the respective unit circuits are signals for selecting two of the 16 blocks in each subarray shown in FIG. 20 at one time. That is, when the signals are set at the high level, corresponding two blocks are selected and activated. When neither of the fuse elements F1, F2 of the programming circuits 35, 36 is melted, the potentials of the output nodes N1, N2 are set at the low level so that the signal X0 will become equal to the logical sum of the three signals $\overline{A10R}$, $\overline{A11R}$ and $\overline{A12R}$, the signal X1 will become equal to the logical sum of the three signals A10R, $\overline{A11R}$ and $\overline{A12R}$, and in the same manner, the other signals are derived as logical sums of the corresponding signals, and the signal X7 will become equal to the logical sum of the three signals A10R, A11R and A12R, and the address assignment shown in FIG. 20 is attained. Therefore, in the case of 4K refresh cycle, the row addresses A12R, $\overline{A12R}$ are both set to the high level by the address input changing circuit and two blocks selected from the 16 blocks are sequentially and simultaneously activated.

On the other hand, if the fuse element F1 is melted, the potential of the node N1 is set to the high level and the potential of the node N2 is set to the low level, and A10R and $\overline{A10R}$ among the addresses for creating the selection signals X0 to X3 are respectively set to the non-selected state and selected state. At this time, since the row addresses A12R, $\overline{A12R}$ are both set to the high level by the address input changing circuit as described before, block selection as shown in FIG. 16 is made.

Likewise, if the fuse element F2 is melted, two blocks are sequentially and simultaneously activated as shown in FIG. 17.

Further, both of the fuse elements F1 and F2 are melted, two blocks are sequentially and simultaneously activated as shown in FIG. 18.

Therefore, when the 4K refresh device is die-sorted, whether it can be relieved without melting the fuse elements F1, F2, it can be relieved by melting the fuse element F1, it can be relieved by melting the fuse element F2, or it can be relieved by melting the fuse elements F1, F2 is checked and the possibility of relief is determined based on the above checking result. When it cannot be relieved by any method, whether it can be relieved as an 8K refresh device or not is checked, and if it cannot be relieved, then it is treated as a defective device. When it is used as an 8K refresh device, signals output from the buffer 37 are used as the row addresses A12R, $\overline{A12R}$ instead of output signals of the inverters 42, 43 in the circuit shown in FIG. 14.

with the above construction and relieving method, the possibility that a device which is determined to be defective as a 4K refresh cycle device by the conventional redundancy technique can be relieved by changing selection of the blocks to be simultaneously selected is high so that the yield of the 4K refresh cycle device can be made closer to the yield of the 8K refresh cycle device.

Figure 6:
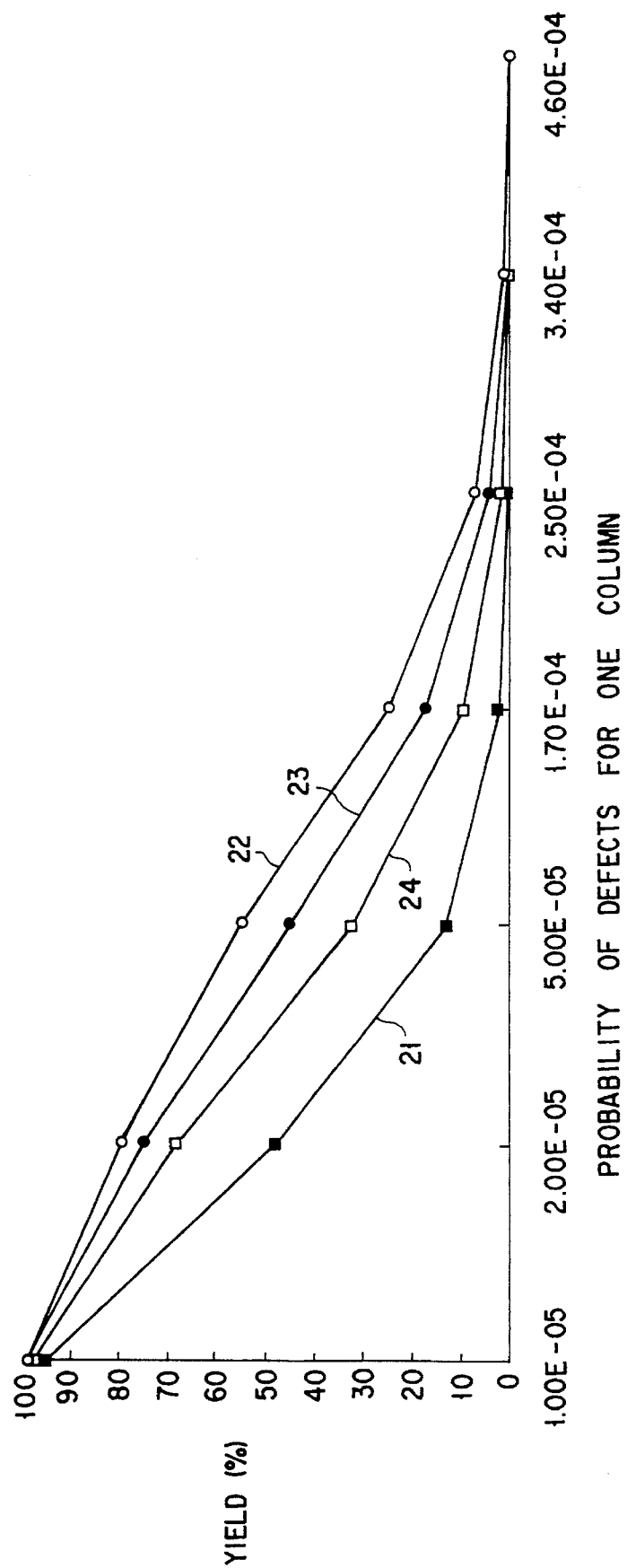
FIG. 6 is a diagram for illustrating the manufacturing yield in a case where the redundancy technique is used in the conventional semiconductor memory device.
Figure 21:
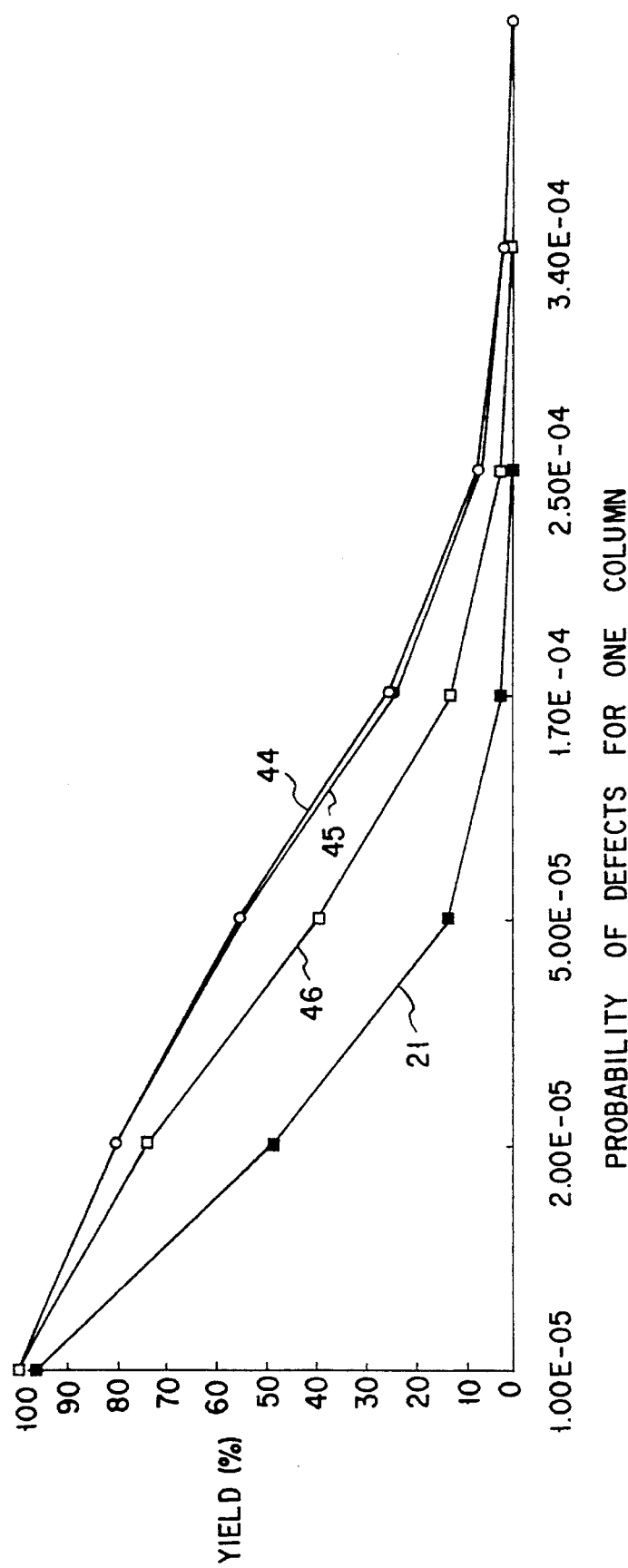
FIG. 21 is a diagram for illustrating the manufacturing yield in a case where this invention is applied and blocks which are simultaneously activated are changed.

FIG. 21 shows the yield of one subarray in the 64-Mbit DRAM, that is, 16 Mbits to which this invention is applied, for illustrating a variation in the manufacturing yield caused by a change of blocks which are simultaneously activated. Like FIG. 6, the abscissa indicates the probability that a randomly selected column is defective and indicates the quality (maturity or the degree of completeness) of the manufacturing line. The ordinate indicates the yield for the probability of defects. In FIG. 21, a solid line 21 indicates the yield in a case where only one column in the 16 Mbits can be compensated for like the case of FIG. 6, and solid lines 44 to 46 indicate yields in a case where this invention is applied. The solid line 44 indicates the yield in the case of 8K refresh cycle, the solid line 45 indicates the yield in the case of 4K refresh cycle, and the solid line 46 indicates the yield in the case of 2K refresh cycle. As is clearly understood by comparing this case with the case of FIG. 6, the yield of the 4K refresh cycle is closer to the yield of the 8K refresh cycle and the yield can be enhanced by several % to approx. 10% except a case where the maturity of the manufacturing line is extremely high or low. Further, the yield can be enhanced by several % when this invention is applied to the 2K refresh cycle.

Figure 22:
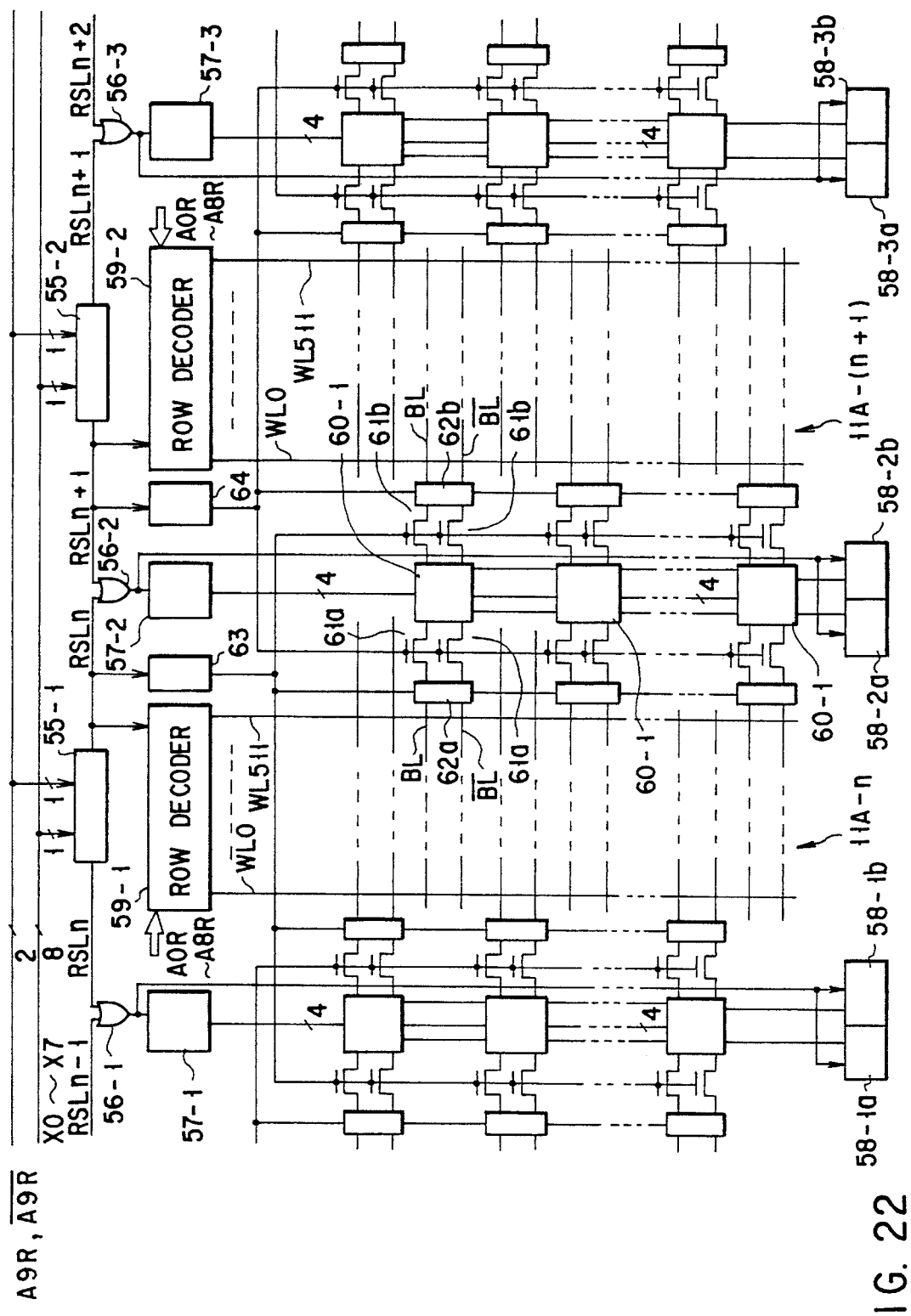
FIG. 22 is a circuit diagram showing another example of the construction of the circuit shown in FIG. 9, for illustrating a semiconductor memory device according to a second embodiment of this invention.

FIG. 22 shows a semiconductor memory device according to a second embodiment of this invention and is a circuit diagram showing another example of the construction of the circuit shown in FIG. 9. FIGS. 23 and 24 respectively show examples of the construction of the block selection signal generators 55-1, 55-2, - - - in the circuit shown in FIG. 22. The circuit shown in FIG. 22 is similar to that shown in FIG. 9 except that fuse elements F3, F4 are provided in the block selection signal generators 55-1, 55-2, - - - and programming (changing of address assignment) of two blocks to be activated is effected by the block selection signal generators 55-1, 55-2, - - - .

The second embodiment is substantially the same as the first embodiment, but is different from the first embodiment in that assignment of the signals x0 to x7 is effected in the central portion (in the peripheral circuit 14) of the chip in the first embodiment and row addresses are supplied to a portion near the cell arrays and programming is effected in this portion in the second embodiment.

As shown in the second embodiment, the fuse elements F3, F4 are provided in the block selection signal generators and two blocks to be activated can be selected according to whether the fuse elements F3, F4 are melted, neither of them is melted, or a selected one of them is melted.

In the above explanation, three examples shown in FIGS. 16 to 18 are explained as block selection examples for selecting blocks such that two blocks in which addresses of defective columns are present will not be simultaneously activated. The block selection examples are examples for suppressing the complexity in the circuit construction and an increase in the pattern occupied area to a minimum and attaining sufficiently large defect relieving effect. However, if the yield is low, another block selection may be used instead of the above three block selection methods, if the yield is high, the selection method may be limited to one of them, and thus the block selection method may be selectively used, as required.

Further, in the above embodiments, a case wherein the 4K refresh cycle device is taken as an example and two blocks are simultaneously activated is explained, but when three or more blocks are activated and the refresh cycle is further lowered, blocks to be activated may be changed in the same manner as described above such that addresses of different defective columns will not lie in the blocks to be simultaneously activated.

Figure 1:
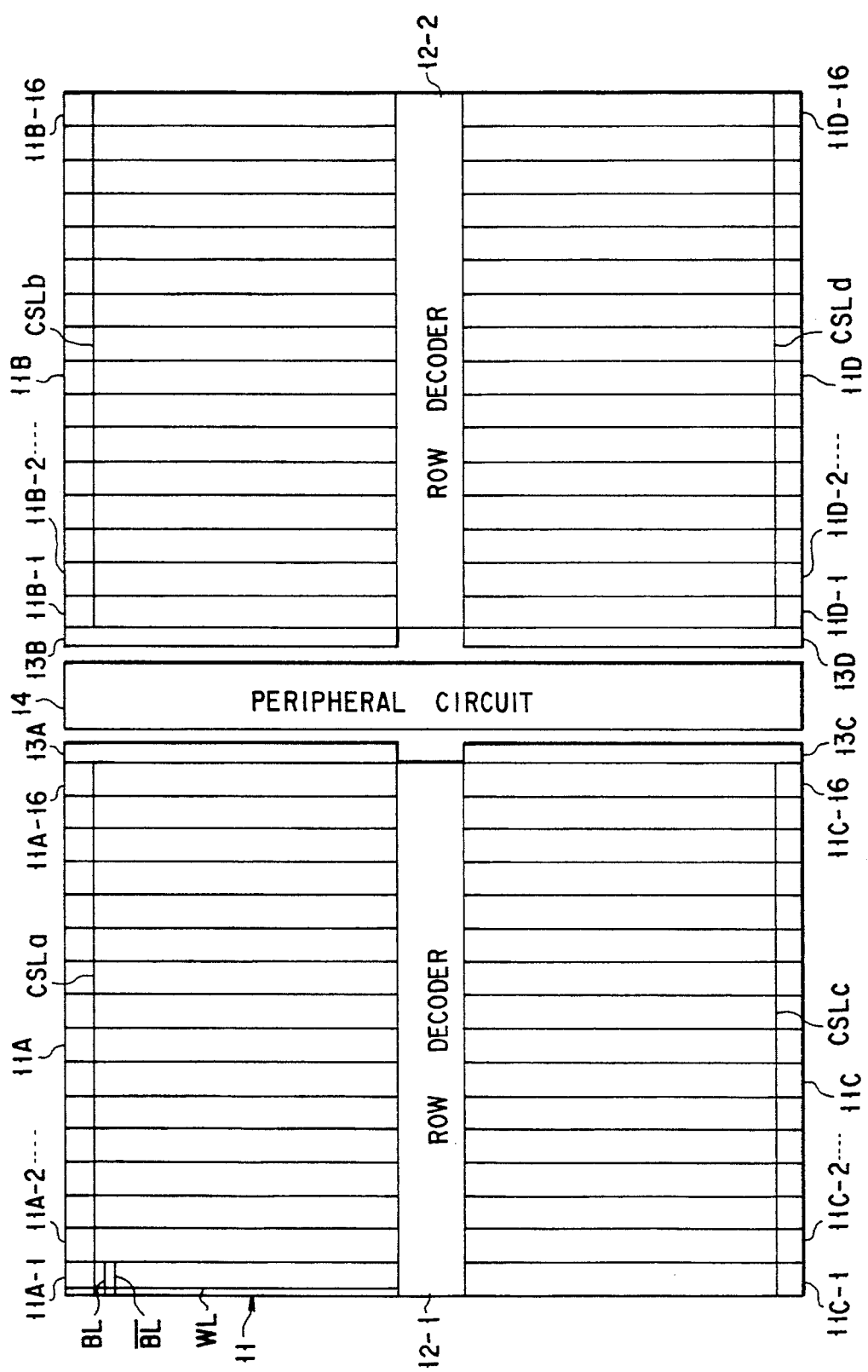
FIG. 1 is a pattern plan view showing an example of the pattern layout of a 64-Mbit DRAM, for illustrating the conventional semiconductor memory device.
Figure 2:
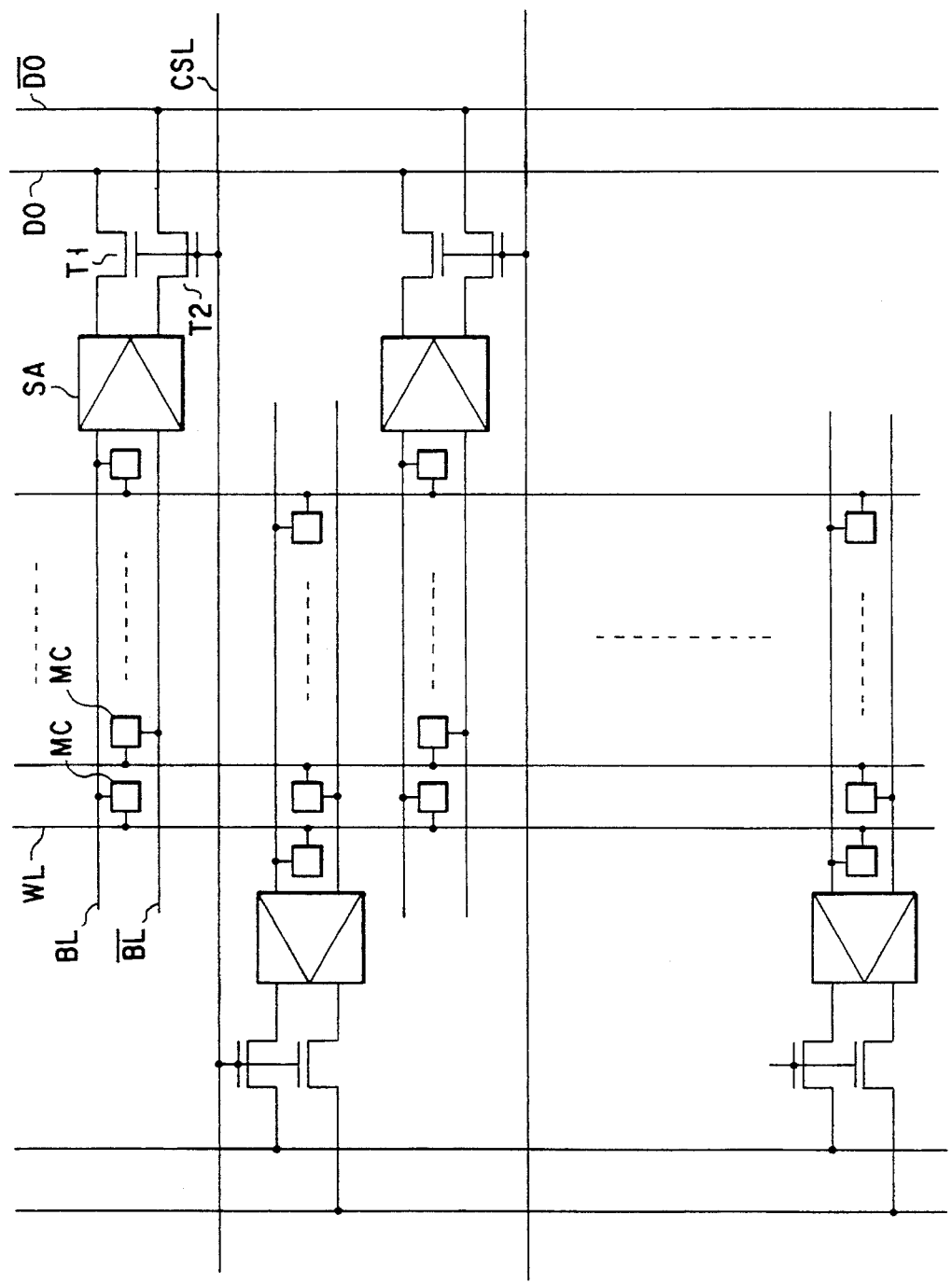
FIG. 2 is a circuit diagram showing an example of the construction of each block in the semiconductor memory device shown in FIG. 1.

Further, in the above embodiments, the construction in which the row decoder is provided in the central portion of the subarrays 11A to 11D is explained, but this invention can be applied to the construction in which the row decoders 12-1, 12-2 are respectively provided in the area between the subarrays 11A and 11C and the area between the subarrays 11B and 11D as in the pattern layout shown in FIG. 1.

As described above, according to this invention, a semiconductor memory device which can be relieved with high probability when a plurality of blocks are activated and addresses of different defective columns are present in the blocks to be simultaneously activated can be attained.

What is claimed is:

1. A semiconductor memory device, comprising:

a memory cell array including rows and columns of memory cells organized into memory cell blocks;

row selecting means for selecting row of memory cells of said memory cell array;

column selecting means for selecting columns of memory cells of said memory cell array;

spare memory cells for replacing defective memory cells of said memory cell array;

spare memory cell selecting means responsive to input addresses which correspond to defective memory cells of said memory cell array for selecting said spare memory cells and for outputting a signal to said column selecting means for inhibiting said column selecting means from selecting columns of memory cells of said memory cell array;

selecting control means for supplying a row address to control said row selecting means to simultaneously activate at least two memory cell blocks; and changing means for selectively changing an assignment of the row address supplied from said selecting control means to thereby change which memory cell blocks are simultaneously activated by said row selecting means.

2. A semiconductor memory device according to claim 1, wherein said changing means is responsive to a signal having a level corresponding to a refresh cycle.

3. A semiconductor memory device according to claim 1, wherein said changing means includes an address assignment changing circuit including a programming circuit which is programmable to indicate whether the row address assignment is changed or not changed, and a changing circuit for changing the row address assignment according to an output of said programming circuit.

4. A semiconductor memory device according to claim 3, wherein said programming circuit includes a load element having a first terminal connected to a first potential supplying source, and a fuse element connected between a second terminal of said load element and a second potential supplying source and whose conduction/melting condition is determined according to whether the row address assignment is changed or not changed, wherein the output of said programming circuit is derived from a connection node between said load element and said fuse element.

5. A semiconductor memory device according to claim 3, further comprising an address input changing circuit for inputting a row address corresponding to a refresh cycle to said address assignment changing circuit.

6. A semiconductor memory device, comprising:

a memory cell array including memory cells arranged in a plurality of subarrays which are each divided into a plurality of memory cell blocks;

row selecting means for selecting rows of said memory cell array;

column selecting means for selecting columns of said memory cell array;

spare memory cells for replacing defective memory cells of said memory cell array;

spare memory cell selecting means responsive to input addresses which correspond to defective memory cells of said memory cell array for selecting said spare memory cells and for outputting a signal to said column selecting means for inhibiting said column selecting means from selecting columns of said memory cell array;

selecting control means for supplying a row address to control said row selecting means to simultaneously activate at least two memory cell blocks in each of said subarrays; and changing means for selectively changing an assignment of the row address supplied from said selecting control means to thereby change which memory cell blocks are simultaneously activated by said row selecting means.

7. A semiconductor memory device according to claim 6, wherein said changing means is responsive to a signal having a level corresponding to a refresh cycle.

8. A semiconductor memory device according to claim 6, wherein said changing means includes an address assignment changing circuit including a programming circuit which is programmable to indicate whether the row address assignment is changed or not changed, and a changing circuit for changing the row address assignment according to an output of said programming circuit.

9. A semiconductor memory device according to claim 8, wherein said programming circuit includes a load element having a first terminal connected to a first potential supplying source, and a fuse element connected between a second terminal of said load element and a second potential supplying source and whose conduction/melting condition is determined according to whether the row address assignment is changed or not changed, wherein the output of said programming circuit is derived from a connection node between said load element and said fuse element.

10. A semiconductor memory device according to claim 8, further comprising an address input changing circuit for inputting a row address corresponding to a refresh cycle to said address assignment changing circuit.

11. A semiconductor memory device, comprising:
a memory cell array including rows and columns of memory cells organized into memory cell blocks;
row selecting means for selecting rows of memory cells of said memory cell array;
column selecting means for selecting columns of memory cells of said memory cell array;
spare memory cells for replacing defective memory cells of said memory cell array;
spare memory cell selecting means responsive to input addresses which correspond to defective memory cells of said memory cell array for selecting said spare memory cells and for outputting a signal to said column selecting means for inhibiting said column selecting means from selecting columns of memory cells of said memory cell array; and
changing means for selectively changing an assignment of a row address supplied to said row selecting means, wherein said row selecting means is responsive to a row address supplied thereto for simultaneously activating at least two memory cell blocks and the changing of the row address assignment by said changing means changes which of said memory cell blocks are simultaneously activated by said row selecting means.

12. A semiconductor memory device according to claim 11, wherein said changing means is responsive to a signal having a level corresponding to a refresh cycle.

13. A semiconductor memory device according to claim 11, wherein said changing means includes an address assignment changing circuit including a programming circuit which is programmable to indicate whether the row address assignment is changed or not changed, and a changing circuit for changing the row address assignment according to an output of said programming circuit.

14. A semiconductor memory device according to claim 13, wherein said programming circuit includes a load element having a first terminal connected to a first potential supplying source, and a fuse element connected between a second terminal of said load element and a second potential supplying source and whose conduction/melting condition is determined according to whether the row address assignment is changed or not changed, wherein the output of said programming circuit is derived from a connection node between said load element and said fuse element.

15. A semiconductor memory device according to claim 13, further comprising an address input changing circuit for inputting a row address corresponding to a refresh cycle to said address assignment changing circuit.

16. A semiconductor memory device, comprising:
a memory cell array including memory cells arranged in a plurality of subarrays which are each divided into a plurality of memory cell blocks;
row selecting means for selecting rows of said memory cell array;
column selecting means for selecting columns of said memory cell array;
spare memory cells for replacing defective memory cells of said memory cell array;
spare memory cell selecting means responsive to input addresses which correspond to defective memory cells of said memory cell array for selecting said spare memory cells and for outputting a signal to said column selecting means for inhibiting said column selecting means from selecting columns of said memory cell array; and
changing means for selectively changing an assignment of a row address supplied to said row selecting means, wherein said row selecting means is responsive to a row address supplied thereto for simultaneously activating at least two memory cell blocks in each of said subarrays and the changing of the row address assignment by said changing means changes which of said memory cell blocks are simultaneously activated by said row selecting means.

17. A semiconductor memory device according to claim 16, wherein said changing means is responsive to a signal having a level corresponding to a refresh cycle.

18. A semiconductor memory device according to claim 16, wherein said changing means includes an address assignment changing circuit including a programming circuit which is programmable to indicate whether the row address assignment is changed or not changed, and a changing circuit for changing the row address assignment according to an output of said programming circuit.

19. A semiconductor memory device according to claim 18, wherein said programming circuit includes a load element having a first terminal connected to a first potential supplying source, and a fuse element connected between a second terminal of said load element and a second potential supplying source and whose conduction/melting condition is determined according to whether the row address assignment; is changed or not changed, wherein the output of said programming circuit is derived from a connection node between said load element and said fuse element.

20. A semiconductor memory device according to claim 18, further comprising an address input changing circuit for inputting a row address corresponding to a refresh cycle to said address assignment changing circuit.

21. A semiconductor memory device, comprising:
a memory cell array including rows and columns of memory cells organized into memory cell blocks;
a row decoder for decoding a row address to select rows of said memory cell array;
a column decoder for decoding a column address to select columns of said memory cell array;
spare memory cells for replacing defective memory cells of said memory cell array;
a spare column decoder, programmed with defective column addresses of said memory cell blocks, for selecting spare memory cells and inhibiting said column decoder from selecting columns of said memory cell array when the decoded column address corresponds to one of the defective column addresses;
a block selecting signal generator for generating a block selecting signal in response to the row address, said block selecting signal generator supplying the block selecting signal to said row decoder such that a plurality of memory cell blocks are simultaneously selected; and
an address assignment changing circuit for selectively changing an assignment of the row address to change the block selecting signal output by said block selecting signal generator.

22. A semiconductor memory device according to claim 21, wherein said address assignment changing circuit is responsive to a signal having a level corresponding to a refresh cycle.

23. A semiconductor memory device according to claim 21, wherein said address assignment changing circuit includes:
- a programming circuit which is programmable to indicate whether the row address assignment is changed or not changed; and
- a changing circuit for changing the row address assignment according to an output of said programming circuit.

24. A semiconductor memory device according to claim 23, wherein said programming circuit includes:
- a load element having a first terminal connected to a first potential supplying source; and
- a fuse element connected between a second terminal of said load element and a second potential supplying source and whose conduction/blow condition is determined according to whether the row address assignment is changed or not changed,
- wherein an output of said programming circuit is derived from a connection node between said load element and said fuse element.

25. A semiconductor memory device according to claim 21, further comprising:
- an address input changing circuit for inputting a row address corresponding to a refresh cycle to said address assignment changing circuit.

26. A semiconductor memory device, comprising:
- a memory cell array including memory cells arranged in a plurality of subarrays which are each divided into a plurality of memory cell blocks;
- a row decoder for decoding a row address to select rows of said memory cell array;
- a column decoder for decoding a column address to select columns of said memory cell array;
- spare memory cells for replacing defective memory cells of said memory cell array;
- a spare column decoder, programmed with defective column addresses of said memory cell blocks, for selecting spare memory cells and inhibiting said column decoder from selecting columns of said memory cell array when the decoded column address corresponds to one of the defective column addresses;
- a block selecting signal generator for generating a block selecting signal in response to the row address, said block selection signal generator supplying the block selection signal to said row decoder such that a plurality of memory cell blocks in each subarray are simultaneously selected; and
- an address assignment changing circuit for selectively changing an assignment of the row address to change the block selecting signal output by said block selection signal generator.

27. A semiconductor memory device according to claim 26, wherein said address assignment changing circuit is responsive to a signal having a level corresponding to a refresh cycle.

28. A semiconductor memory device according to claim 26, wherein said address assignment changing circuit includes:
- a programming circuit which is programmable to indicate whether the row address assignment is changed or not changed; and
- a changing circuit for changing the row address assignment according to an output of said programming circuit.

29. A semiconductor memory device according to claim 28, wherein said programming circuit includes:
- a load element having a first terminal connected to a first potential supplying source; and
- a fuse element connected between a second terminal of said load element and a second potential supplying source and whose conduction/blow condition is determined according to whether the row address assignment is changed or not changed,
- wherein the output of said programming circuit is derived from a connection node between said load element and said fuse element.

30. A semiconductor memory device according to claim 28, further comprising:
- an address input changing circuit for inputting a row address corresponding to a refresh cycle to said address assignment changing circuit.

31. A semiconductor memory device, comprising:
- a memory cell array including rows and columns of memory cells organized into memory cell blocks;
- a row decoder for decoding a row address to select rows of memory cells of said memory cell array;
- a column decoder for decoding a column address to select columns of memory cells of said memory cell array;
- spare memory cells for replacing defective memory cells of said memory cell array;
- a spare column decoder, programmed with defective column addresses of said memory cell blocks, for selecting spare memory cells and inhibiting said column decoder from selecting columns of memory cells of said memory cell array when the decoded column address corresponds to one of the defective column addresses; and
- an address assignment changing circuit for selectively changing an assignment of the row address in order to change which memory cell blocks are simultaneously activated by said row decoder.

32. A semiconductor memory device according to claim 31, wherein said address assignment changing circuit is responsive to a signal having a level corresponding to a refresh cycle.

33. A semiconductor memory device according to claim 31, wherein said address assignment changing circuit includes:
- a programming circuit which is programmable to indicate whether the row address assignment is changed or not changed; and
- a changing circuit for changing the row address assignment according to an output of said programming circuit.

34. A semiconductor memory device according to claim 33, wherein said programming circuit includes:
- a load element having a first terminal connected to a first potential supplying source; and
- a fuse element connected between a second terminal of said load element and a second potential supplying source and whose conduction/blow condition is determined according to whether the row address assignment is changed or not changed,
- wherein an output of said programming circuit is derived from a connection node between said load element and said fuse element.

35. A semiconductor memory device according to claim 30, further comprising:

an address input changing circuit for inputting a row address corresponding to a refresh cycle to said address assignment changing circuit.

36. A semiconductor memory device, comprising:

a memory cell array including memory cells arranged in a plurality of subarrays which are each divided into a plurality of memory cell blocks;

a row decoder for decoding a row address to select rows of said memory cell array;

a column decoder for decoding a column address to select columns of said memory cell array;

spare memory cells for replacing defective memory cells of said memory cell array;

a spare column decoder, programmed with defective column addresses of said memory cell blocks, for selecting spare memory cells and inhibiting said column decoder from selecting columns of said memory cell array when the decoded column address corresponds to one of the defective column addresses; and an address assignment changing circuit for selectively changing an assignment of the row address to change which memory cell blocks are simultaneously activated by said row decoder.

37. A semiconductor memory device according to claim 36, wherein said address assignment changing circuit is responsive to a signal having a level corresponding to a refresh cycle.

38. A semiconductor memory device according to claim 36, wherein said address assignment changing circuit includes:

a programming circuit which is programmable to indicate whether the row address assignment is changed or not changed is programmed; and a changing circuit for changing the row address assignment according to an output of said programming circuit.

39. A semiconductor memory device according to claim 38, wherein said programming circuit includes:

a load element having a first terminal connected to a first potential supplying source; and a fuse element connected between a second terminal of said load element and a second potential supplying source and whose conduction/blow condition is determined according to whether the row address assignment is changed or not changed, wherein an output of said programming circuit is derived from a connection node between said load element and said fuse element.

40. A semiconductor memory device according to claim 36, further comprising:

an address input changing circuit for inputting a row address corresponding to a refresh cycle to said address assignment changing circuit.

* * * * *